US012761765B2

(12) United States Patent
Lim

(10) Patent No.: US 12,761,765 B2
(45) Date of Patent: *Oct. 13, 2026

(54) ELECTRONIC DEVICE

(71) Applicant: SAMSUNG DISPLAY CO., LTD., Yongin-si (KR)

(72) Inventor: Sanghyun Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/170,153

(22) Filed: Apr. 4, 2025

(65) Prior Publication Data

US 2025/0231652 A1 Jul. 17, 2025

Related U.S. Application Data

(63) Continuation of application No. 18/520,762, filed on Nov. 28, 2023, now Pat. No. 12,293,052.

(30) Foreign Application Priority Data

Mar. 16, 2023 (KR) ........................ 10-2023-0034765

(51) Int. Cl.
*G06F 3/044* (2006.01)
*G06F 3/041* (2006.01)
*H10K 59/40* (2023.01)

(52) U.S. Cl.
CPC .......... *G06F 3/0446* (2019.05); *G06F 3/0412* (2013.01); *G06F 3/0448* (2019.05); *H10K 59/40* (2023.02); *G06F 2203/04111* (2013.01)

(58) Field of Classification Search
None
See application file for complete search history.

(56) References Cited

U.S. PATENT DOCUMENTS 7,656,392 B2 2/2010 Bolender
11,163,387 B2 11/2021 Jeon et al.
11,320,944 B2 5/2022 Ko et al.
11,803,280 B2 10/2023 Hu et al.
12,293,052 B2 * 5/2025 Lim ...................... G06F 3/0412
2016/0085334 A1 3/2016 Hashimoto
(Continued)

FOREIGN PATENT DOCUMENTS

KR 10-2018-0029178 3/2018
KR 10-2021-0125649 10/2021
KR 10-2022-0006980 1/2022

*Primary Examiner* — Ifedayo B Iluyomade
(74) *Attorney, Agent, or Firm* — F. CHAU & ASSOCIATES, LLC

(57) ABSTRACT

Provided is an electronic device. The electronic device includes a display panel and an input sensing part disposed on the display panel and including a first area, a second area configured to surround the first area, and a third area configured to surround the second area. The input sensing part includes first to third nodes, which are disposed on the first to third area, respectively, and each of the first to third nodes includes a first connection pattern and a second sensing pattern including a third pattern and a fourth pattern spaced apart from each other in a second direction. At least a portion of the second nodes has a shape different from that of each of the first nodes, and at least portion of the third nodes a shape different from that of each of the first nodes.

20 Claims, 22 Drawing Sheets

(56) References Cited

U.S. PATENT DOCUMENTS

| | | | |
|---|---|---|---|
| 2018/0074609 | A1 | 3/2018 | Jeon et al. |
| 2018/0120988 | A1 | 5/2018 | Kim et al. |
| 2019/0204974 | A1 | 7/2019 | Gong |
| 2020/0104014 | A1 | 4/2020 | Gong |
| 2020/0371644 | A1 | 11/2020 | Choi et al. |
| 2021/0004112 | A1 | 1/2021 | Miyamoto |
| 2022/0350438 | A1 | 11/2022 | Lin et al. |
| 2024/0310966 | A1 | 9/2024 | Lim |

* cited by examiner

ELECTRONIC DEVICE

CROSS-REFERENCE TO RELATED APPLICATIONS

This U.S. non-provisional patent application is a continuation of U.S. patent application Ser. No. 18/520,762 filed on Nov. 28, 2023, which claims priority under 35 U.S.C. § 119 to Korean Patent Application No. 10-2023-0034765, filed on Mar. 16, 2023, the entire contents of which are hereby incorporated by reference.

BACKGROUND

The present disclosure herein relates to an electronic device, and more particularly, to an electronic device having improved sensing reliability.

Touch screens that include an active area have been developed. An electronic device having a touch screen can detect a user's touch that is applied from the outside through an active area, while simultaneously displaying various images that provide information to the user. The electronic device can include an active area that can be activated to generate an electrical signal.

In recent years, as electronic devices having various shapes are developed, active areas having various shapes are being realized.

SUMMARY

The present disclosure provides an electronic device having improved sensing reliability on a touch area having various shapes.

An embodiment of the inventive concept provides an electronic device including: an input sensing part on an active area of a display panel, where the input sensing part includes a first area, a second area around the first area, and a third area surrounding the first area and the second area, wherein the input sensing part includes first to third nodes disposed on the first to third areas, respectively; where each of the first to third nodes includes: a first connection pattern; a first sensing pattern including a first pattern and a second pattern spaced apart from each other in a first direction with the first connection pattern therebetween; a second connection pattern; and a second sensing pattern including a third pattern and a fourth pattern spaced apart from each other in a second direction crossing the first direction with the second connection pattern therebetween, wherein at least a portion of the second nodes has a shape different from that of each of the first nodes, and at least portion of the third nodes have a shape different from that of each of the first nodes.

In an embodiment, in each of the first to third nodes, the second connection pattern may have a shape integrated with the second sensing pattern, where a center of gravity of the second connection pattern is at a central point.

In an embodiment, an outer line of the third area may be defined by a first closed line of which at least a portion has a curvature.

In an embodiment, an outer line of the first area may be defined by a second closed line having a polygonal shape, the second area and the third area may be divided by a third closed line, wherein the third closed line may include: first division lines facing sides of the second closed line, respectively; and second division lines configured to connect the first division lines to each other.

In an embodiment, at least a portion of the first division lines may include a portion extending in a direction different from an extending direction of a facing side of the sides of the second closed line.

In an embodiment, a point at which the first connection pattern and the second connection pattern, which are provided in each of the first to third nodes, cross each other may be a central point, and the central points disposed in the second nodes adjacent to one first division line may be arranged in a same direction as an extending direction of a side facing one side of the sides of the second closed line.

In an embodiment, one pattern adjacent to the second closed line among the first to fourth patterns provided in each of the second nodes may have the same shape and area as one of the first to fourth patterns provided in each of the first nodes.

In an embodiment, a point at which the first connection pattern and the second connection pattern, which are provided in each of the first to third nodes, cross each other may be a central point, and the central points disposed in the third nodes adjacent to one first division line may be arranged in a direction different from an arrangement direction of the central points disposed in the first nodes.

In an embodiment, the first closed line may include straight sides and at least one curved side disposed between the straight sides.

In an embodiment, the first nodes may have the same area and shape.

In an embodiment, the second nodes may include a first sub-node and a second sub-node, which have areas different from each other, and each of the first and second sub-nodes may include two sides extending in direction different from each other and facing each other.

An embodiment of the inventive concept provides an electronic device including: a display panel comprising an active area and a peripheral area adjacent to the active area, and an input sensing part on the display panel and comprising a first area, a second area configured to surround the first area, and a third area configured to surround the second area, wherein the first area, the second area, and the third area overlap the active area, wherein the input sensing part comprises first to third nodes, which are disposed on the first to third areas, respectively, wherein each of the first to third nodes has a first connection pattern, a first sensing pattern comprising a first pattern and a second pattern spaced apart from each other in a first direction with the first connection pattern therebetween, a second connection pattern, and a second sensing pattern comprising a third pattern and a fourth pattern spaced apart from each other in a second direction crossing the first direction with the second connection pattern therebetween, wherein the second nodes comprise a first sub-node and a second sub-node, which have areas different from each other, each of the first and second sub-nodes comprises two sides extending in direction different from each other, wherein at least a portion of the second nodes has a shape different from that of each of the first nodes, and at least portion of the third nodes a shape different from that of each of the first nodes.

In an embodiment, the third nodes may include a third sub-node and a fourth sub-node, which have areas different from each other, and one side of each of the third and fourth sub-nodes may have a curvature.

In an embodiment, each of the first to fourth sub-nodes may have an asymmetrical shape with respect to one diagonal.

In an embodiment, the third sub-node may be spaced apart from the first area in one direction with the first sub-node therebetween, and two sides of the first sub-node, which extend in the one direction, may have a same length as two sides of the third node, which extend in the one direction, respectively.

In an embodiment, the third sub-node may be spaced apart from the first area in one direction with the first sub-node therebetween, and the fourth sub-node is spaced apart from the first area in the one direction with the second sub-node therebetween, and the first sub-node has an area greater than that of the second sub-node, and the third sub-node may have an area greater than that of the fourth sub-node.

In an embodiment, a maximum spaced distance between a side having a curvature of the third sub-node and the first area may be greater than that between a side having a curvature of the fourth sub-node and the first area, a point, at which the first connection pattern and the second connection pattern, which are provided in one of the first to third nodes, may be a central point, and a spaced distance between the central point disposed in the third sub-node and the first area may be greater than that between the central point disposed in the fourth sub-node and the first area.

In an embodiment, each of the second nodes may have an area equal to or greater than about ½ of an area of each of the first nodes, and each of the third nodes may have an area equal to or greater than about ½ of an area of each of the first nodes.

In an embodiment, the input sensing part may include at least one insulating layer, the second connection pattern, the first sensing pattern, and the second sensing pattern may be disposed on the same layer, the first connection pattern may be disposed on a layer different from the layer, on which the second connection pattern, the first sensing pattern, and the second sensing pattern are disposed, with the insulating layer therebetween, and the first connection pattern may be electrically connected to the first sensing pattern through a contact hole passing through the insulating layer.

In an embodiment, the display panel may include a base layer, a circuit layer, a light emitting element layer, an encapsulation layer, and the input sensing part may be directly disposed on the encapsulation layer.

In an embodiment of the inventive concept, an electronic device includes: a display panel including an active area and a peripheral area adjacent to the active area; and an input sensing part disposed on the display panel and including a first area, a second area configured to surround the first area, and a third area configured to surround the second area, wherein each of the first area, the second area, and the third area overlaps the active area, wherein the first area is divided into a plurality of first nodes, the second area is divided into a plurality of second nodes, and the third area is divided into a plurality of third nodes, wherein the second nodes includes a first sub-node and a second sub-node, which have areas different from each other, and the third nodes includes a third sub-node and a fourth sub-node, which have areas different from each other.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1A:
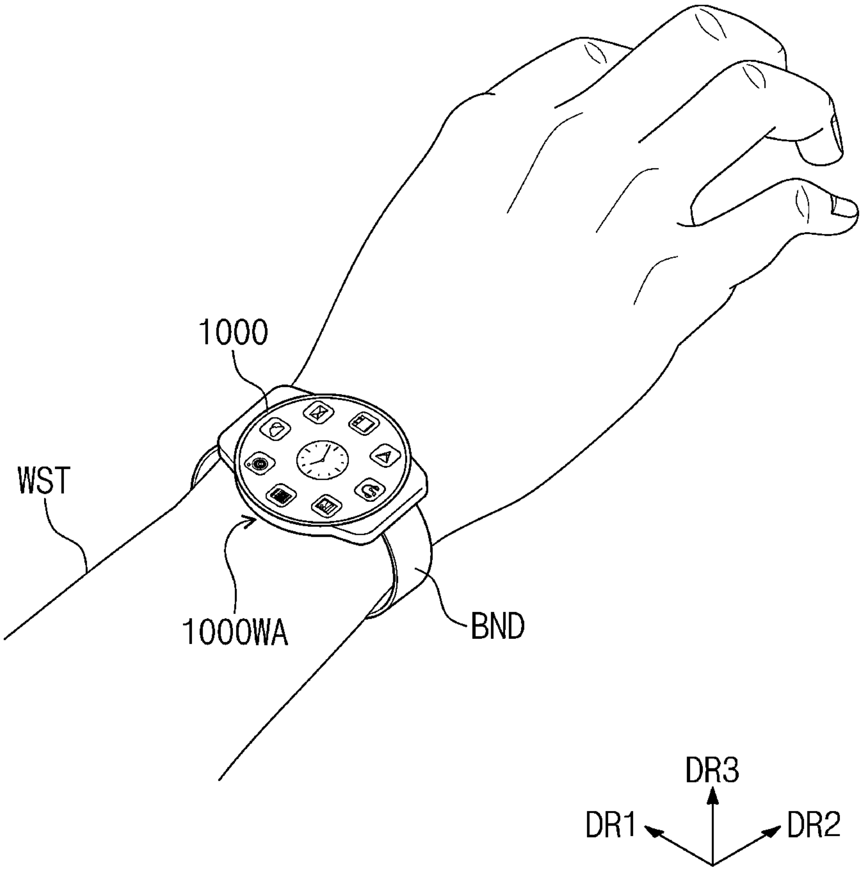
FIG. 1A is a perspective view illustrating a state of use of an electronic device according to an embodiment of the inventive concept.

In this specification, it will also be understood that when one component (or region, layer, portion) is referred to as being ‘on’, ‘connected to’, or ‘coupled to’ another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration. The term “and/or” includes any and all combinations of one or more of the associated components.

It will be understood that although the terms such as ‘first’ and ‘second’ are used herein to describe various elements, these elements should not be limited by these terms. These terms are used only to distinguish one component from other components. For example, a first element referred to as a first element in an embodiment can be referred to as a second element in another embodiment without departing from the scope of the appended claims. The terms of a singular form may include plural forms unless referred to the contrary.

Also, “under”, “below”, “on’, “above”, and the like are used for describing the relationships and associations between the elements illustrated in the drawings. The terms may be a relative concept and described based on directions expressed in the drawings.

The meaning of 'include' or 'comprise' specifies a property, a fixed number, a process, an operation, an element, a component or a combination thereof, but does not exclude other properties, fixed numbers, processes, operations, elements, components or combinations thereof.

Unless otherwise defined, all terms (including technical and scientific terms) used herein have the same meaning as commonly understood by a person of ordinary skill in the art to which the inventive concept belongs. In addition, terms such as those defined in commonly used dictionaries should be interpreted as having a meaning consistent with the meaning in the context of the related technology, and unless explicitly defined herein, the terms should not be interpreted as too ideal or too formal.

Hereinafter, embodiments of the inventive concept will be described with reference to the accompanying drawings.

Figure 1B:
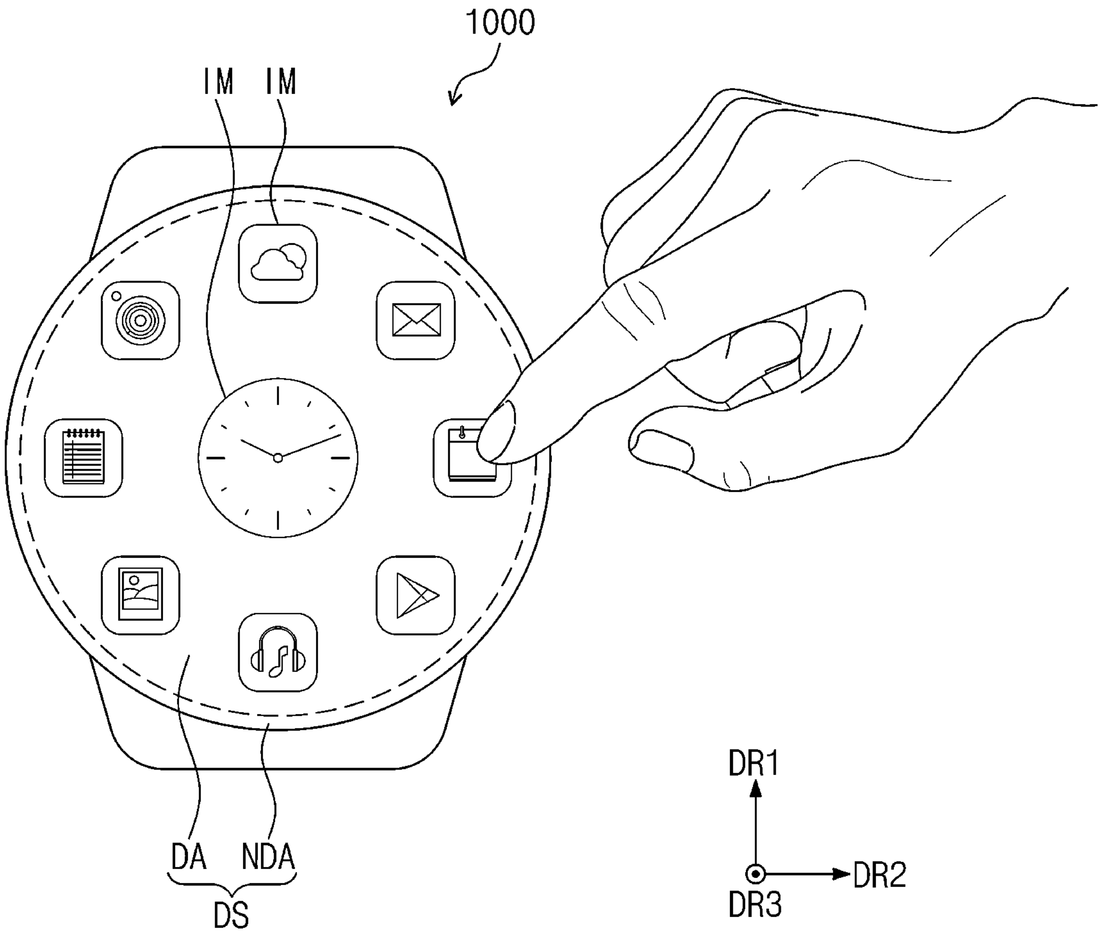
FIG. 1B is a plan view of the electronic device according to an embodiment of the inventive concept.

FIG. 1A is a perspective view illustrating a state of use of an electronic device according to an embodiment of the inventive concept. FIG. 1B is a plan view of the electronic device according to an embodiment of the inventive concept.

Referring to FIGS. 1A and 1B, an electronic device 1000 may be incorporated into a wearable device 1000WA.

The electronic device 1000 may display time information, weather information, as well as icons for performing various applications or operations. The user may operate the electronic device 1000 through a touch operation. While the electronic device 1000 is depicted as having a circular shape, other shapes, including square, rectangular, and polygonal are also intended to be included within the scope of the embodiments and claims.

In various embodiments, a user may wear the wearable device 1000WA on the user's wrist WST or in a manner otherwise enabling use of the wearable device 1000WA. The wearable device 1000WA may include an electronic device 1000 and a band BND connected to the electronic device 1000, where the band may be utilized to secure the wearable device 1000WA to the user. The user, for example, may place the band BND around the wrist WST to wear the wearable device 1000WA on the wrist WST. The electronic device 1000 may be disposed toward the user.

In various embodiments, the wearable device 1000WA may provide various images IM to the user, where the images IM may represent a time and various software applications displayed as various icons to the user. For example, the electronic device 1000 of the wearable device 1000WA may display and provide hour and minute hands indicating time to the user. Also, the electronic device 1000 may display and provide various applications to the user arranged on the electronic device 1000.

The display device 1000 may be a touch-type display device, where for example, when the user touches the applications (e.g., icons) displayed on the electronic device 1000, the touched applications may be executed. For example, in response to the user touching a weather application among the applications displayed on the electronic device 1000, the weather information may be provided to the user.

In various embodiments, a top surface of the electronic device 1000 may be a display surface DS, where the display surface DS can include a plane defined by the first direction DR1 and the second direction DR2. The first direction DR1 and the second direction DR2 may be defined as directions perpendicular to each other.

Hereinafter, a direction that substantially perpendicularly crosses a plane defined by the first direction DR1 and the second direction DR2 is defined as a third direction DR3. In addition, in this specification, the term "viewed on the plane" may mean a state viewed in the third direction D3.

Referring to FIG. 1B, a display surface DS may include an active area DA and a peripheral area NDA adjacent to the active area DA. The images IM generated on the electronic device 1000 may be provided to the user through the display surface DS. The electronic device 1000 may display an image through the active area DA of the display surface DS and detect an input that is applied from the outside. The peripheral area NDA may surround the active area DA and define an edge of the display device DD, where the peripheral area NDA may be printed with a predetermined color. The color of the peripheral area NDA may be different from a color of the active area DA.

In various embodiments, the active area DA may have a circular shape, where the circular shape can be within a plane. The shape of the active area DA, however, is not limited thereto. For example, the active area DA may have various shapes having a curvature along at least a portion thereof, including, but not limited to, an oval shape, an elliptical shape, or a semicircular shape.

Although the electronic device and the active area DA are illustrated as having shapes corresponding to each other in FIG. 1, the embodiments of the inventive concept are not limited thereto. For example, the electronic device 1000 and the active area DA may have shapes that are independent of each other.

Figure 2:
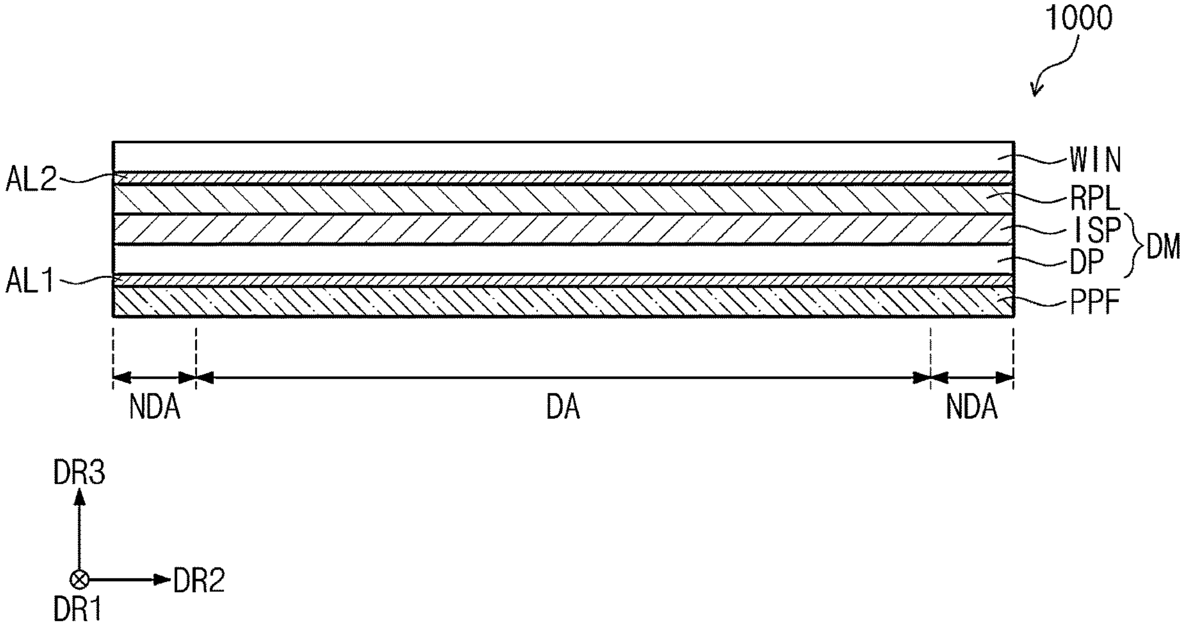
FIG. 2 is a schematic cross-sectional view of the electronic device according to an embodiment of the inventive concept.

FIG. 2 is a schematic cross-sectional view of the electronic device according to an embodiment of the inventive concept.

Referring to FIG. 2, the electronic device 1000 according to this embodiment may include a display module DM, an anti-reflection layer RPL, a window WIN, a panel protection film PPF, and first and second adhesion layers AL1 and AL2. The display module DM, an anti-reflection layer RPL, a window WIN, a panel protection film PPF, and first and second adhesion layers AL1 and AL2 may extend across the active area DA and extend into the peripheral area NDA on one or both sides of the active area DA. The display module DM according to this embodiment may include a display panel DP and an input sensing part ISP. The anti-reflection layer RPL may be on a surface of the input sensing part ISP, and the first adhesion layer AL1 may be on a surface of the display panel DP.

The display panel DP may be a flexible display panel. The display panel DP according to an embodiment of the inventive concept may be an emission type display panel, but is not limited thereto. For example, the display panel DP may be an organic light emitting display panel or an inorganic light emitting display panel. An emission layer of an organic light emitting display panel may include an organic light emitting material. An emission layer of the inorganic light emitting display panel may include a quantum dot, a quantum rod, and the like. Hereinafter, the display panel DP is described as an organic light emitting display panel, although embodiments are not intended to be limited thereto.

In various embodiments, the input sensing part ISP may be disposed on the display panel DP. The input sensing part ISP may detect a touch applied to the display module DM from the outside of the electronic device 1000. The touch applied from the outside may be provided in various manners. The input sensing part ISP may recognize a state in which a portion of a human digit, such as a user's finger, approaches or contacts the electronic device 1000 as a touch. Alternatively, the input sensing part ISP may recognize a state in which a portion of an inanimate object such as a stylus pen approaches or contacts the electronic device 1000 as a touch. The input sensing part ISP may detect an external touch provided through various manners, but is not limited to any one embodiment.

In various embodiments, the input sensing part ISP may be manufactured directly on the display panel DP when the display device DD is manufactured; however, the embodiment of the inventive concept is not limited thereto, and the input sensing part ISP may be provided as a panel that is separated from the display panel DP and may be attached to the display panel DP by an adhesion layer, where the adhesion layer is a transparent material allowing observation of the display panel DP.

The anti-reflection layer RPL may be disposed on the input sensing part ISP. The anti-reflection layer RPL may be defined as an external light anti-reflection film, where the anti-reflection layer RPL may reduce reflectance of external light incident from an upper side of the display device 1000 toward the display panel DP. The anti-reflection layer RPL may improve viewability of the display panel DP by reducing interfering light reflected from the surfaces and interfaces.

When the external light traveling toward the display panel DP is reflected from the display panel DP and provided again to an external user, the user may visually see the external light reflected from an internal surface, as if from a mirror. To avoid this phenomenon from occurring, for example, the anti-reflection layer RPL may include a plurality of color filters displaying the same color as pixels of the display panel DP.

The color filters may filter external light to display the same color as that of the pixels. In this case, the reflected, external light may not be visually recognized by the user. When manufacturing the display device DD, the anti-reflection layer RPL including the color filters may be directly manufactured on the input sensing part ISP, where the color filters may be formed on the surface of the input sensing part ISP.

In various embodiments, the anti-reflection layer RPL may include a polarizing film including a phase retarder and/or a polarizer to reduce the reflectance of the external light. The anti-reflection layer RPL including the polarizing film may be manufactured as a separate panel with respect to the input sensing part ISP and attached to the input sensing part ISP by the adhesion layer.

The window WIN may be disposed on the anti-reflection layer RPL. The window WIN may protect the display panel DP, the input sensing part ISP, and the anti-reflection layer RPL against external scratches and impacts, where the window WIN can be a transparent material to allow transmission of light, while providing a more durable layer than the anti-reflection layer RPL, input sensing part ISP, and/or display panel DP.

The panel protection film PPF may be disposed under the display panel DP. The panel protection film PPF may protect a lower portion of the display panel DP. The panel protection film PPF may include a flexible plastic material such as polyethylene terephthalate (PET).

The first adhesion layer AL1 may be disposed between the display panel DP and the panel protection film PPF, where the display panel DP and the panel protection film PPF may be bonded to each other by the first adhesion layer AL1. The second adhesion layer AL2 may be disposed between the anti-reflection layer RPL and the window WIN, where the anti-reflection layer RPL and the window WIN may be bonded to each other by a second adhesion layer AL2. The first adhesion layer AL1 and the second adhesion layer AL2 may be transparent materials that allow viewing of the display panel DP.

Figure 3:
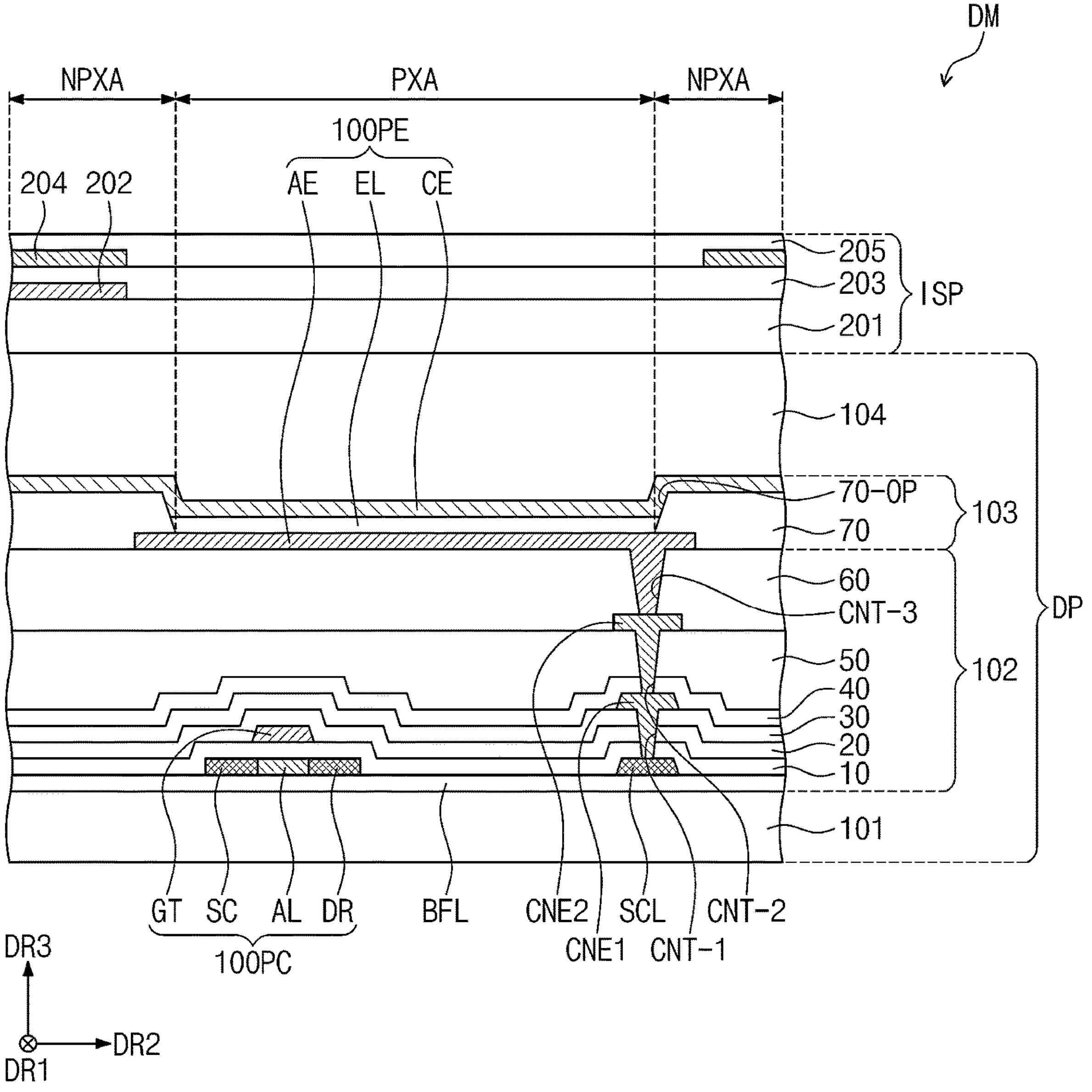
FIG. 3 is an enlarged cross-sectional view illustrating a partial area of a display module according to an embodiment of the inventive concept.

FIG. 3 is an enlarged cross-sectional view illustrating a partial area of the display module according to an embodiment of the inventive concept.

Referring to FIG. 3, the display module DM may include a display panel DP and an input sensing part ISP, where the input sensing part ISP is on the display panel DP. FIG. 3 illustrates an example in which the input sensing part ISP is formed on the display panel DP through a continuous process, where the input sensing part ISP can be directly disposed on the display panel DP. A separate adhesion member may not be disposed between the input sensing part ISP and the display panel DP. The input sensing part ISP may form an interface with the display panel DP.

The display panel DP may include a base layer 101, a circuit layer 102, a light emitting element layer 103, and an encapsulation layer 104.

In various embodiments, the base layer 101 may be a member that provides a base surface on which a circuit layer 102 is disposed and support for overlying layers. The base layer 101 may be a glass substrate, a metal substrate, or a polymer substrate. However, the embodiment of the inventive concept is not limited thereto. For example, the base layer 101 may be an inorganic layer, an organic layer, or a composite layer.

In various embodiments, the base layer 101 may have a multilayered structure, for example, the base layer 101 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer. In various embodiments, a multilayer base layer 101 may include different numbers of layers and/or different materials for each of the different layers.

Each of the first and second synthetic resin layers may include a polyimide-based resin. Also, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. As used herein, the "~~"-based resin refers to a functional group of "~~", and can indicate a polymer class and/or primary monomer type.

The circuit layer 102 may be disposed on the base layer 101, where the circuit layer 102 may include an insulating layer 10, a semiconductor pattern, a conductive pattern, and a signal line SCL. The insulating layer 10, the semiconductor layer, and the conductive layer may be formed on the base layer 101 in a manner such as coating or vapor deposition, and then, the insulating layer, the semiconductor layer, and the conductive layer may be selectively patterned through a plurality of photolithography processes. Thereafter, the semiconductor pattern, the conductive pattern, and the signal line SCL included in the circuit layer 102 may be provided.

At least one inorganic layer may be disposed on a top surface of the base layer 101. The inorganic layer may include at least one of aluminum oxide, titanium oxide, silicon oxide, silicon nitride, silicon oxynitride, zirconium oxide, or hafnium oxide. The inorganic layer may be provided as a multilayer. The multilayered inorganic layer may constitute a barrier layer and/or a buffer layer. In this embodiment, the circuit layer 102 is illustrated as including a buffer layer BFL, where the buffer layer BFL separates the base layer 101 from the insulating layer 10.

The buffer layer BFL may improve the bonding force between the base layer 101 and the semiconductor pattern. The buffer layer BFL may be made of at least one of silicon oxide, silicon nitride, or silicon oxynitride. For example, the buffer layer BFL may include a structure in which the silicon oxide layer and the silicon nitride layer are alternately stacked.

The semiconductor pattern may be disposed on the buffer layer BFL. The semiconductor pattern may include polysilicon; however, the embodiments of the inventive concept are not limited thereto. For example, the semiconductor pattern may include amorphous silicon, low-temperature polycrystalline silicon, or an oxide semiconductor.

FIG. 3 illustrates a portion of the semiconductor pattern, where the semiconductor pattern may be further disposed on other areas of the display module DM. The semiconductor pattern may be arranged in a specific rule over pixels. The semiconductor pattern has different electrical properties depending on whether the semiconductor pattern is doped or undoped. The semiconductor pattern may include a first region having high conductivity and a second region having low conductivity. The first region may be doped with an N-type dopant or a P-type dopant. A P-type transistor may include a doped region doped with the P-type dopant, and an N-type transistor may include a doped region doped with the N-type dopant, where the regions may constitute a device source and/or drain. The second region may be a non-doped region or may be doped at a concentration less than that of the first region, where the second region can be a device channel.

The first region may have conductivity greater than that of the second region and may substantially serve as an electrode or a signal line. The second region may substantially correspond to an active (or channel) of the transistor. That is to say, a portion of the semiconductor pattern may be an active region of the transistor, another portion may be a source region or drain region of the transistor, and yet another portion may be a connection electrode or a connection signal line.

In various embodiments, each of the pixels may have an equivalent circuit including a plurality of transistors, at least one capacitor, and a light emitting element, and an equivalent circuit diagram of the pixel may be modified in various forms. In FIG. 3, one transistor 100PC and a light emitting element 100PE provided in the pixel are illustrated as an example. The transistor 100PC can be arranged below the light emitting element 100PE.

In various embodiments, a source SC, an active region AL, and a drain DR of the transistor 100PC may be provided from the semiconductor pattern, where the active region AL can form a transistor device channel. The source SC and the drain DR may extend in opposite directions from the active region AL on a cross-section, where the active region AL can be adjoining and in electrical contact with both the source SC and the drain DR. FIG. 3 also illustrates a portion of a connection signal line SCL formed from a semiconductor pattern, where the connection signal line SCL may be electrically connected to the drain DR of the transistor 100PC on the plane of the first insulating layer 10.

A first insulating layer 10 may be disposed on the buffer layer BFL, where the first insulating layer 10 may overlap the plurality of pixels PX to cover the semiconductor pattern. The first insulating layer 10 may include an inorganic layer and/or an organic layer, and have a single-layered or multilayered structure. The first insulating layer 10 may include at least one of aluminum oxide, titanium oxide, silicon oxide, silicon nitride, silicon oxynitride, zirconium oxide, or hafnium oxide. In an embodiment, the first insulating layer 10 may include a single-layered silicon oxide layer. The insulating layer of the circuit layer 102, which will be described later, as well as the first insulating layer 10 may be an inorganic layer and/or an organic layer and may have a single-layered or a multilayered structure. The inorganic layer may include at least one of the above-described materials, but is not limited thereto.

A gate GT of the transistor 100PC is disposed on the first insulating layer 10, where the first insulating layer 10 can physically and electrically separate the gate GT from the active region Al, as well as the source SC and the drain DR. The gate GT overlaps the active AL. The gate GT may be a portion of a metal pattern. In the process of doping the semiconductor pattern, the gate GT may function as a mask.

In various embodiments, the second insulating layer 20 may be disposed on the first insulating layer 10 and cover the gate GT. A second insulating layer 20 may overlap the pixels. The second insulating layer 20 may be an inorganic layer and/or an organic layer and have a single-layered or multilayered structure. The second insulating layer 20 may include at least one of silicon oxide, silicon nitride, or silicon oxynitride. In this embodiment, the second insulating layer 20 may have a multilayer structure including a silicon oxide layer and a silicon nitride layer.

A third insulating layer 30 may be disposed on the second insulating layer 20, where the third insulating layer 30 may have a single layer or multilayer structure. For example, the third insulating layer 30 may have a multilayer structure including a silicon oxide layer and a silicon nitride layer.

A first connection electrode CNE1 may be disposed on the third insulating layer 30, where the first connection electrode CNE1 may cover a portion of the third insulating layer 30. The first connection electrode CNE1 may be electrically connected to the connection signal line SCL through a contact hole CNT-1 passing through the first to third insulating layers 10 to 30. The first connection electrode CNE1 may extend through the third insulating layer 30, second insulating layer 20, and first insulating layer 10 to the connection signal line SCL.

A fourth insulating layer 40 may be disposed on the third insulating layer 30, where the fourth insulating layer 40 may cover the first connection electrode CNE1 on the third insulating layer 30. The fourth insulating layer 40 may be a single-layered silicon oxide layer. A fifth insulating layer 50 may be disposed on the fourth insulating layer 40, where the fifth insulating layer 50 may cover the fourth insulating layer 40. The fifth insulating layer 50 may be an organic layer.

A second connection electrode CNE2 may be disposed on the fifth insulating layer 50, where the second connection electrode CNE2 may cover a portion of the fifth insulating layer 50. The second connection electrode CNE2 may be electrically connected to the first connection electrode CNE1 through a contact hole CNT-2 passing through the fourth and fifth insulating layers 40 and 50. The second connection electrode CNE2 may extend through the fifth insulating layer 50 and the fourth insulating layer 40 to the first connection electrode CNE1, and be electrically connected to the connection signal line SCL.

A sixth insulating layer 60 may be disposed on the fifth insulating layer 50 and cover the second connection electrode CNE2. The sixth insulating layer 60 may cover the fifth insulating layer 50. The sixth insulating layer 60 may be an organic layer.

A light emitting element layer 103 may be disposed on the circuit layer 102. The light emitting element layer 103 may include a light emitting element 100PE, where the light emitting element 100PE may include an organic light emitting material, quantum dots, quantum rods, a micro LED, or a nano LED. Hereinafter, the light emitting device 100PE is described as an example of an organic light emitting element, but is not particularly limited thereto.

In various embodiments, the light emitting element 100PE may include a first electrode AE, an emission layer EL, and a second electrode CE.

The first electrode AE may be disposed on the sixth insulating layer 60. The first electrode AE may be connected to the second connection electrode CNE2 through a contact hole CNT-3 passing through the sixth insulating layer 60. The first electrode AE may be electrically connected to the first connection electrode CNE1 and the connection signal line SCL through the second connection electrode CNE2, and also electrically connected to the transistor 100PC through the connection signal line SCL.

A pixel defining layer 70 may be disposed on the sixth insulating layer 60 and cover a portion of the first electrode AE. An opening 70-OP can be in the pixel defining layer 70, where the opening 70-OP of the pixel defining layer 70 exposes at least a portion of the first electrode AE. The pixel defining layer 70 may surround a portion of the first electrode AE and an emission layer EL on the first electrode AE, where the opening 70-OP may define the extent of the emission layer EL.

The display area DA (e.g., see FIG. 1B and FIG. 2) may include an emission area PXA and a non-emission area NPXA adjacent to the emission area PXA (e.g., see FIG. 3). The non-emission area NPXA may surround the emission area PXA. In an embodiment, an emission area PXA may be defined to correspond to a portion of an area of the first electrode AE, which is exposed by the opening 70-OP.

The emission layer EL may be disposed on the first electrode AE, where the emission layer EL may be disposed on an area corresponding to the opening 70-OP. The emission layer EL may be separated into different portions for each of the pixels. When the emission layer EL is separate for each of the pixels, each of the emission layers EL may emit light having at least one of blue, red, or green color. However, the embodiment of the inventive concept is not limited thereto. For example, the emission layer EL may be provided to be connected to the pixels. In this case, the emission layer EL may provide blue light or white light.

In various embodiments, a second electrode CE may be disposed on the emission layer EL. The second electrode CE may have an integrated shape and be disposed on the plurality of pixels. The second electrode CE may be on the emission layer EL and extend up the sidewalls of the opening 70-OP, where the second electrode CE may cover at least a portion of the pixel defining layer 70 surrounding the emission area PXA.

In various embodiments, a hole control layer may be disposed between the first electrode AE and the emission layer EL. The hole control layer may be disposed on the emission area PXA and the non-emission area NPXA. The hole control layer may include a hole transport layer and may further include a hole injection layer. An electron control layer may be disposed between the emission layer EL and the second electrode CE. The electron control layer may include an electron transport layer and may further include an electron injection layer. The hole control layer and the electron control layer may be formed in the plurality of pixels by using an open mask.

An encapsulation layer 104 may be disposed on the light emitting element layer 103, where the encapsulation layer 104 may cover the second electrode CE and pixel defining layer 70. The encapsulation layer 104 may include an inorganic layer, an organic layer, and an inorganic layer, which are sequentially stacked, but layers constituting the encapsulation layer 104 are not limited thereto.

In various embodiments, the inorganic layers may protect the light emitting element layer 103 against moisture and oxygen, and the organic layer may protect the light emitting element layer 103 against foreign substances such as dust particles. The inorganic layers may include a silicon nitride layer, a silicon oxy nitride layer, a silicon oxide layer, a titanium oxide layer, or an aluminum oxide layer. The organic layer may include an acrylic-based organic layer, but the embodiment of the inventive concept is not limited thereto.

The input sensing part ISP may include a base layer 201, conductive layers 202 and 204, and insulating layers 203 and 205. The base layer 201 may be disposed directly on the encapsulation layer 104. The insulating layers 203 and 205 may include first and second insulating layers 203 and 205, which can be sequentially laminated on the base layer 201; however, this is illustrated as an example, and the number of insulating layers constituting each of the insulating layers 203 and 205 is not limited thereto.

The base layer 201 may be a multilayer including at least one inorganic layer including one of silicon nitride, silicon oxynitride, or silicon oxide. Alternatively, the, base layer 201 may be an organic layer including an epoxy resin, an acrylic resin, or an imide-based resin. The base layer 201 may have a single-layered structure or a multilayered structure in which a plurality of layers are stacked in the third direction DR3 to form a laminated structure.

The conductive layers 202 and 204 may include a first conductive layer 202 and a second conductive layer 204. The first conductive layer 202 may be disposed on the base layer 201 and covered by the first insulating layer 203, and the second conductive layer 204 may be disposed on the first insulating layer 203 and covered by the second insulating layer 205. A portion of the second conductive layer 204 may be connected to the first conductive layer 202 through a contact hole defined in the first insulating layer 203. Each of the conductive layers 202 and 204 may have a single-layer structure or a multi-layer structure, in which the conductive layers 202 and 204 are stacked along the third direction DR3.

In various embodiments, a conductive layer 202 and 204 having a single-layered structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), indium zinc tin oxide (IZTO), or the like. In addition, the transparent conductive layer may include conductive polymers such as PEDOT, metal nanowires, graphene, and the like.

A conductive layer having a multilayered structure may include metal layers. The metal layers may have a three-layered structure of titanium/aluminum/titanium. The conductive layer having the multilayered structure may include at least one metal layer and at least one transparent conductive layer, where the transparent conductive layer can be stacked on the metal layer.

Although the first conductive layer 202 and the second conductive layer 204 may include a transparent conductive oxide or may have a metal mesh shape made of an opaque conductive material, an image displayed by light generated by the light emitting element layer 103 can be seen by a user. The first conductive layer 202 and the second conductive layer 204 may also have various other materials and various other shapes that allow visibility of an image displayed by the light emitting element layer 103 that is sufficiently clear to the user.

At least one of the first insulating layer 203 or the second insulating layer 205 may include an inorganic layer. The inorganic layer may include at least one of aluminum oxide, titanium oxide, silicon oxide, silicon nitride, silicon oxynitride, zirconium oxide, or hafnium oxide.

In addition, at least one of the first insulating layer 203 or the second insulating layer 205 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

Figure 4:
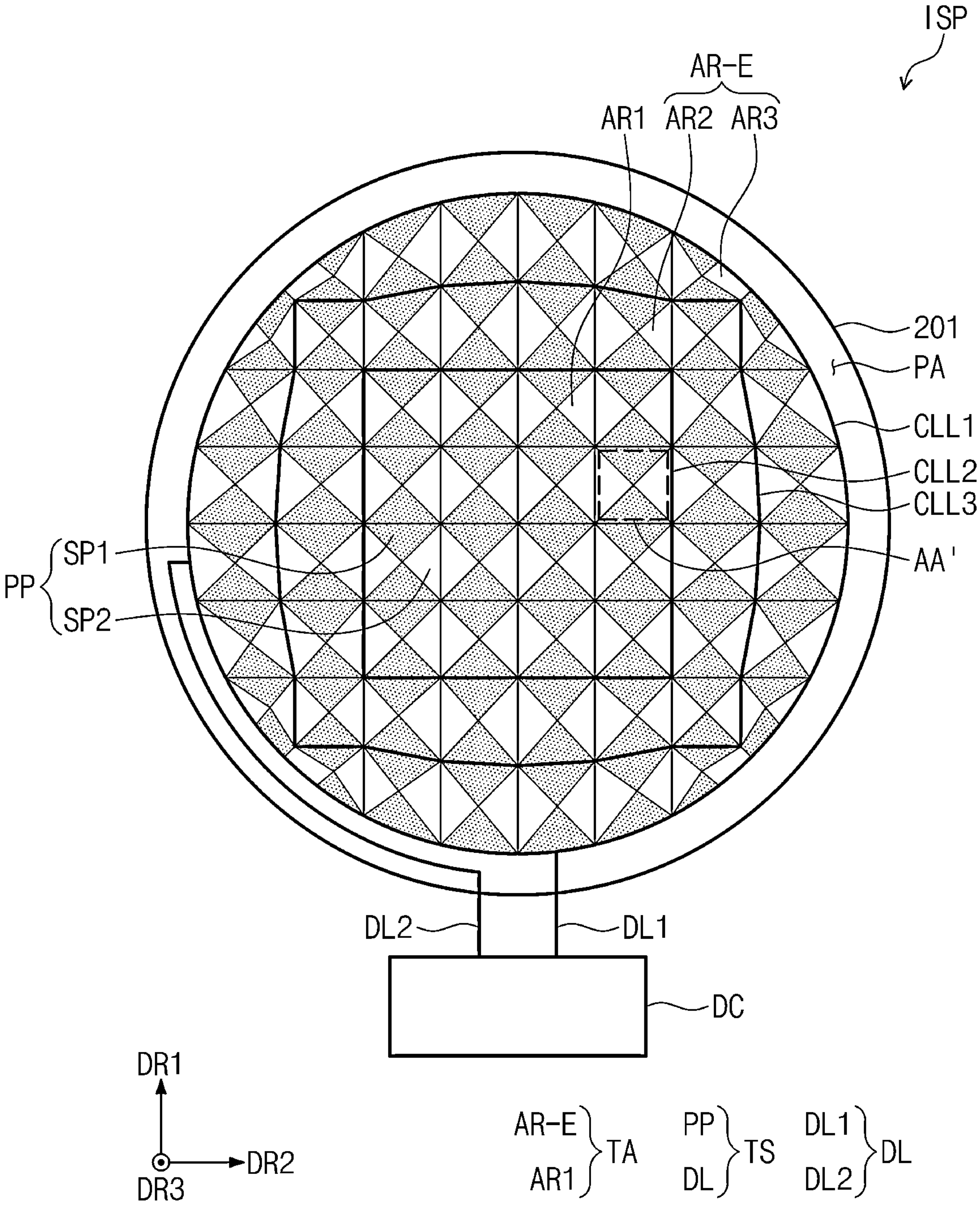
FIG. 4 is a plan view of an input sensing part according to an embodiment of the inventive concept.
Figure 5A:
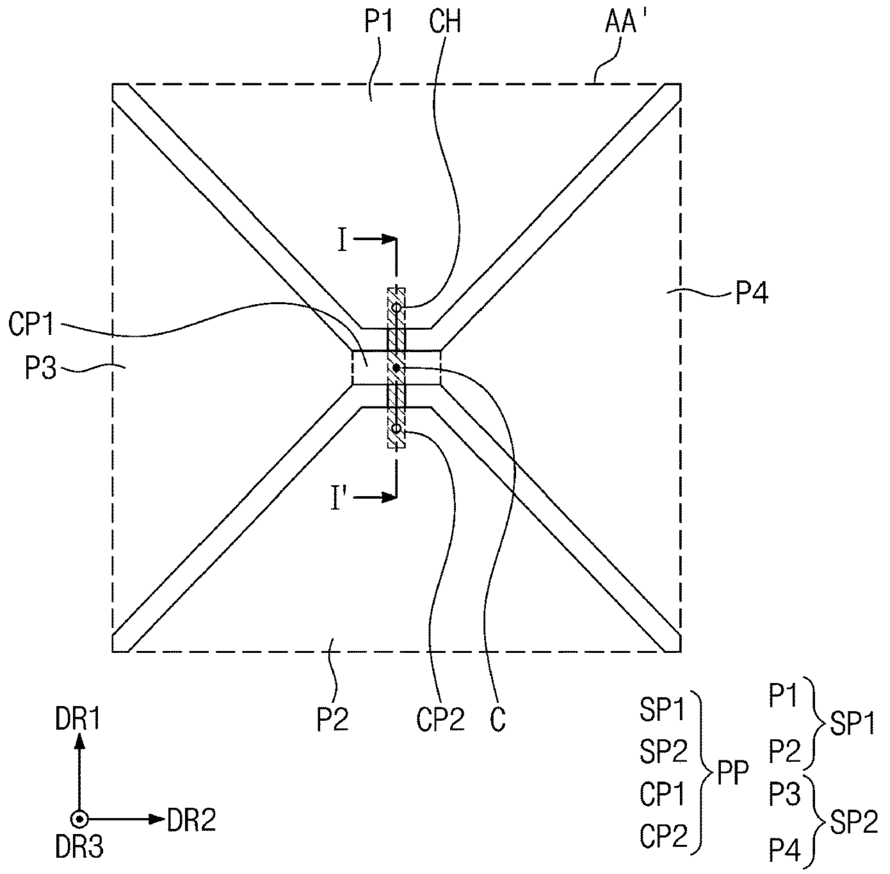
FIG. 5A is an enlarged plan view illustrating an area AA' of FIG. 4 in the input sensing part according to an embodiment of the inventive concept.
Figure 5B:
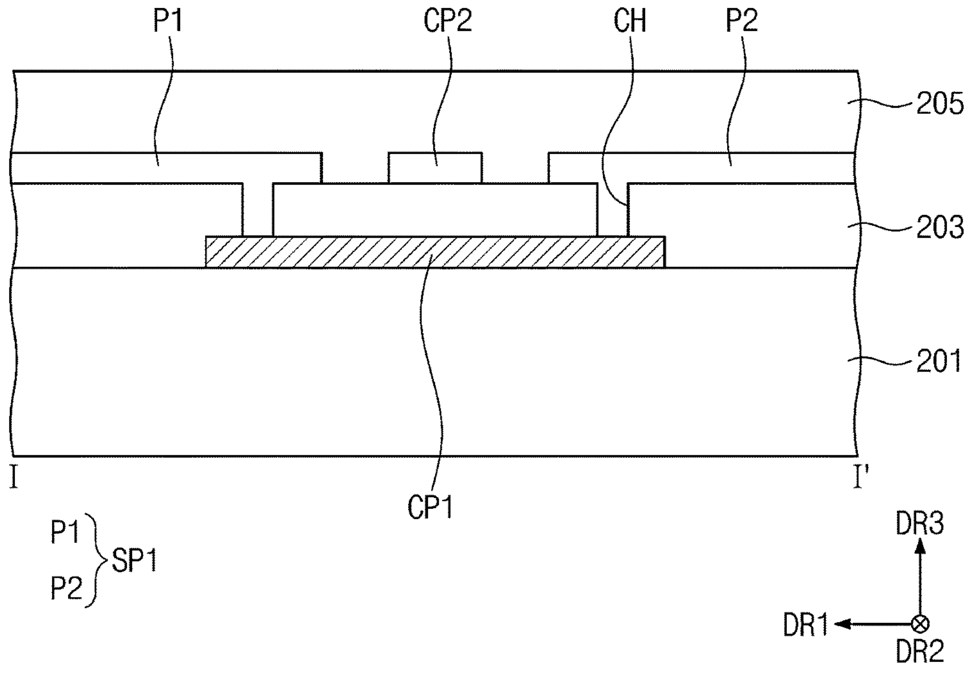
FIG. 5B is a cross-sectional view illustrating the input sensing part, taken along line I-I' of FIG. 5A according to an embodiment of the inventive concept.

FIG. 4 is a plan view of the input sensing part according to an embodiment of the inventive concept. FIG. 5A is an enlarged plan view illustrating an area AA' of FIG. 4, t according to an embodiment of the inventive concept. FIG. 5B is a cross-sectional view illustrating the input sensing part, taken along line I-I' of FIG. 5A, according to an embodiment of the inventive concept.

Referring to FIG. 4, the input sensing part ISP may include a base layer 201, a touch sensor TS, and a driving circuit DC. The base layer 201 may be a base layer on which the touch sensor TS is disposed, where the input sensing part ISP may include the base layer 201, with the conductive layers 202 and 204, and insulating layers 203 and 205 on the base layer 201. The touch sensor TS may include a plurality of patterns PP and a driving line DL.

In various embodiments, the base layer 201 is divided into a touch area TA and a peripheral area PA. The touch area TA may correspond to the active area DA of the electronic device 1000 described above with reference to FIG. 1B, and the peripheral area PA of the base layer 201 may correspond to the peripheral area NDA of the electronic device 1000 described above with reference to FIG. 1B. The active area DA of the electronic device 1000 described above with reference to FIG. 2 can include the display panel DP and the input sensing part ISP of the display module DM within the peripheral area NDA. The peripheral area PA of the base layer 201 in FIG. 4 may correspond to the peripheral area NDA of the electronic device 1000 in FIG. 2. The touch area TA may include a center area AR1 and an outer area AR-E.

The touch area TA may be an area surrounded by a first closed line CLL1, where the first closed line CLL1 may be an outer line of the touch area TA. A shape of the touch area TA may correspond to a shape of the first closed line CLL1, for example, a circular shape, as illustrated in FIG. 4, although other shapes are also contemplated within the scope of the embodiments and claims.

The first closed line CLL1 may be defined as a simple closed curve, and at least a portion thereof may have a predetermined curvature and/or radius of curvature. In other words, the first closed line CLL1 may have a curvature along at least a portion thereof. The first closed-line CLL1 may be, for example, an oval, a circle, an ellipse, a shape made of one curve and a plurality of straight lines, a shape made of one straight line and a plurality of curves, or a shape made of a plurality of curves and a plurality of straight lines, where the curved portions may have different radii of curvature. The touch area TA may have various shapes according to the shape of the first closed line CLL1.

FIG. 4 illustrates an example in which the first closed line CLL1 is a circular closed line, and the touch area TA has a circular shape on the plane (e.g., a disk).

The touch area TA may include a center area AR1 and an outer area AR-E. The center area AR1 and the outer area AR-E may be divided by a virtual second closed line CLL2 defined in the touch area TA.

The center area AR1 may be an area defined inside the second closed line CLL2 and surrounded by the second closed line CLL2. The second closed line CLL2 may be defined as an outer line of the center area AR1. In this specification, the center area AR1 may also be referred to as a first area AR1. The outer area AR-E may be an area defined as outside the second closed line CLL2 and surrounded by the first closed line CLL1, where the outer area AR-E may be between and delineated by the first closed line CLL1 and the second closed line CLL2.

In an embodiment, the second closed line CLL2 may be defined as a single closed curve including a plurality of straight lines. The second closed line CLL2 may have a polygonal shape including a plurality of sides, where each of the sides may be a straight line.

FIG. 4 illustrates an example in which the second closed line CLL2 forms a square closed line, and the center area AR1 has a square shape on the plane.

The outer area AR-E may include a second area AR2 surrounding the center area AR1 (or the first area AR1) and a third area AR3 surrounding the second area AR2. The second area AR2 and the third area AR3 may be divided by a virtual third closed line CLL3 defined on the outer area AR-E. The second area AR2 may be an area defined inside the third closed line CLL3 and surrounded by the third closed line CLL3, where the second area AR2 may be between and delineated by the second closed line CLL2 and the third closed line CLL3. The third area AR3 may be an area defined outside the third closed line CLL3 and surrounded by the first closed line CLL1, where the third area AR3 may be between and delineated by the third closed line CLL3 and the first closed line CLL1. An outer line of the third area AR3 may be defined by the first closed line CLL1, and at least a portion of the outer line of the third area AR3 may have a curvature. The center area AR1 (or the first area AR1), second area AR2, and third area AR3 may overlap the active area DA, where the active area DA can be defined by the first closed line CLL1, where the first closed line CLL1 may be an outer boundary of the touch area TA, which can correspond to the active area DA. Detailed descriptions of the first to third areas AR1 to AR3 will be described later.

The third closed line CLL3 may be defined as a simple closed curve, and at least a portion thereof may have a predetermined curvature and/or radius of curvature. In other words, the third closed line CLL3 may have a curvature along at least a portion thereof.

The touch sensor TS may include a plurality of patterns PP and a driving line DL. The patterns PP may be disposed on the touch area TA. The patterns PP may include a conductive material. Conductivity of the patterns PP may affect touch sensitivity of the touch sensor TS.

In various embodiments, the patterns PP may include a transparent material, where the patterns PP may include a transparent conductive oxide. For example, the patterns PP may include at least one of indium zinc oxide (IZO), indium tin oxide (ITO), indium gallium oxide (IGO), indium zinc gallium oxide (IGZO), or a mixture/compound thereof. Thus, components disposed below the touch sensor TS may be easily visually recognized from the outside regardless of the touch sensor TS.

In various embodiments, the patterns PP may include a plurality of mesh lines. For example, the patterns PP may include a metal mesh structure. The visibility of the touch sensor TS may be reduced even with the patterns PP being made of an opaque material. The embodiment in which the patterns PP include the mesh structure will be described later with reference to FIGS. 5C and 5D.

The patterns PP may include first sensing patterns SP1 and second sensing patterns SP2, which can cross each other and be separated from each other. FIG. 4 illustrates the first sensing patterns SP1 as hatched.

The first sensing patterns SP1 may be arranged in a direction crossing the first direction DR1 (e.g., the second direction DR2) and in the first direction DR1. In the first sensing patterns SP1, the first sensing patterns may be electrically connected to each other in a direction crossing the first direction DR1.

The second sensing patterns SP2 may be arranged in a direction crossing the second direction DR2 (e.g., the first direction DR1) and in the second direction DR2. In the second sensing patterns SP2, the second sensing patterns may be electrically connected to each other in a direction crossing the second direction DR2.

Referring to FIGS. 5A and 5B, the patterns PP may include first sensing patterns SP1, second sensing patterns SP2, a first connection pattern CP1, and a second connection pattern CP2.

In FIG. 5A, one node (corresponding to a first node N1 to be described later) within a center area AR1 (see FIG. 4) may be illustrated to be enlarged, and the descriptions to be described later with reference to FIGS. 5A and 5B may be similarly applied to nodes within an peripheral area AR-E (see FIG. 4).

The first sensing patterns SP1 may include a first pattern P1 and a second pattern P2, where the first pattern P1 and second pattern P2 can be separate and spaced apart from each other in the first direction DR1. The first connection pattern CP1 may be disposed between the first pattern P1 and the second pattern P2, where the first pattern P1 and the second pattern P2 may be spaced apart from each other with the first connection pattern CP1 therebetween. The first connection pattern CP1 may electrically connect the first pattern P1 and the second pattern P2 to each other.

The second sensing patterns SP2 may include a third pattern P3 and a fourth pattern P4, where the first pattern P1 and second pattern P2 can be separate and spaced apart from each other in the second direction DR2. The second connection pattern CP2 may be disposed between the third pattern P3 and the fourth pattern P4, where the third pattern P3 and the fourth pattern P4 may be spaced apart from each other with the second connection pattern CP2 therebetween. The second connection pattern CP2 may electrically connect the third pattern P3 and the fourth pattern P4 to each other. The second connection pattern CP2 may have a shape that is integrated with the third and fourth patterns P3 and P4. The second connection pattern CP2 may cross the first connection pattern CP1 while being electrically insulated from the first connection pattern CP1. The second connection pattern CP2 may be electrically insulated from the first connection pattern CP1 by a portion of the first insulating layer 203 disposed therebetween The first sensing patterns SP1, the second sensing patterns SP2, and the second connection pattern CP2 may be disposed on the same layer, and the first connection pattern CP1 may be disposed on a layer different from that on which the first sensing patterns SP1, the second sensing patterns SP2, and the second connection pattern CP2 are disposed, with at least one insulating layer therebetween.

Referring to FIG. 5B, the first connection pattern CP1 may be disposed on the base layer 201 and covered by the first insulating layer 203, where the first connection pattern CP1 may be provided in the first conductive layer 202 described above with reference to FIG. 3. The first sensing patterns SP1, the second sensing patterns SP2, and the second connection pattern CP2 may be disposed on the first insulating layer 203 and covered by the second insulating layer 205, where the first sensing patterns SP1, the second sensing patterns SP2, and the second connection pattern CP2 may be provided in the second conductive layer 204 described above with reference to FIG. 3. The first sensing patterns SP1, the second sensing patterns SP2, and the second connection pattern CP2 may be disposed on the same layer, and the first connection pattern CP1 may be disposed on a different layer, where an insulating layer can separate the layers. A contact hole can pass through at least one insulating layer.

The first sensing patterns SP1 may be electrically connected to each other by being connected to the first connection pattern CP1 through through-holes CH passing through the first insulating layer 203.

In various embodiments, the arrangement may be reversed and the first sensing patterns SP1, the second sensing patterns SP2, and the second connection pattern CP2 may be provided in the first conductive layer 202, whereas the first connection pattern CP1 may be provided in the second conductive layer 204.

In the present specification, a central point C may be located in the second connection pattern CP2 having a shape that is integrated with the third and fourth patterns P3 and P4. More specifically, the central point C may be defined as the center of gravity of the second connection pattern CP2. In an embodiment, the first and second connection patterns CP1 and CP2 may cross each other at the central point C, while being electrically insulated from each other.

Referring to FIGS. 5A and 4 together, in this embodiment, a first pattern P1 disposed on a first node and a second pattern P2 disposed on a second node adjacent to the first node in the first direction DR1 may provide one first sensing pattern SP1, where the first sensing pattern SP1, as shown in FIG. 4, can have a shape determined by the combination of the first pattern P1 and second pattern P2 (e.g., a square). That is to say, a first sensing pattern SP1 may be divided into first and second patterns P1 and P2 by an outer edge of the first node.

A third pattern P3 disposed on the first node and a fourth pattern P4 on a third node adjacent to the first node in the second direction DR2 may provide one second sensing pattern SP2, where the second sensing pattern SP2, as shown in FIG. 4, can have a shape determined by the combination of the third pattern P3 and fourth pattern P4 (e.g., a square) . . . . That is to say, a second sensing pattern SP2 may be divided into third and fourth patterns P3 and P4 by an outer edge of the first node.

Referring again to FIG. 4, the driving lines DL may be disposed on the peripheral area PA, where the driving lines DL may include a first driving line DL1 and a second driving line DL2. Each of the driving lines DL, first driving line DL1 and second driving line DL2, may be connected to one of the patterns PP to electrically connect the driving circuit DC to the touch area TA of the input sensing part ISP. The driving lines DL may provide electrical signals from the driving circuit DC to the touch area TA or transmit an external touch sensing signal generated on the touch area TA to the driving circuit DC.

The driving lines DL may be electrically connected to a corresponding pattern of the patterns adjacent to the first closed curve CLL1 of the patterns PP to activate the entire touch area TA. The driving lines DL may be electrically connected to the patterns PP in the third area AR3.

In an embodiment, the driving lines DL may include a first driving line DL1 and a second driving line DL2. Although FIG. 4 illustrates a single first driving line DL1 and a single second driving line DL2 for easy description, the first driving line DL1 may be provided in plurality, so that the plurality of first driving lines can be electrically connected to ends adjacent to the first closed curve CLL1 of the first sensing patterns SP1, respectively, and the second driving line DL2 may be provided in plurality, so that the plurality of second driving lines can be electrically connected to ends adjacent to the first closed curve CLL1 of the second sensing patterns SP2, respectively. The driving circuit DC may include at least one driving element, where the driving element may generate an electrical signal to be provided to the touch area TA or may process an electrical signal received from the touch area TA. A plurality of driving elements may be electrically connected to each other through conductive lines.

In various embodiments, the driving circuit DC may be separately provided outside the base layer 201. Thus, the driving circuit DC may be disposed on a separate layer, such as a flexible substrate and connected to the driving line DL through a separate line or the like.

Alternatively, the driving circuit DC may be mounted on the base layer 201. Here, the driving line DL may be directly connected to the driving circuit DC. Thus, the input sensing part ISP may be simplified by mounting both the touch sensor TS and the driving circuit DC on the base layer 201. The driving circuit DC may be provided in various forms, and may not be limited to any one embodiment.

Figure 5C:
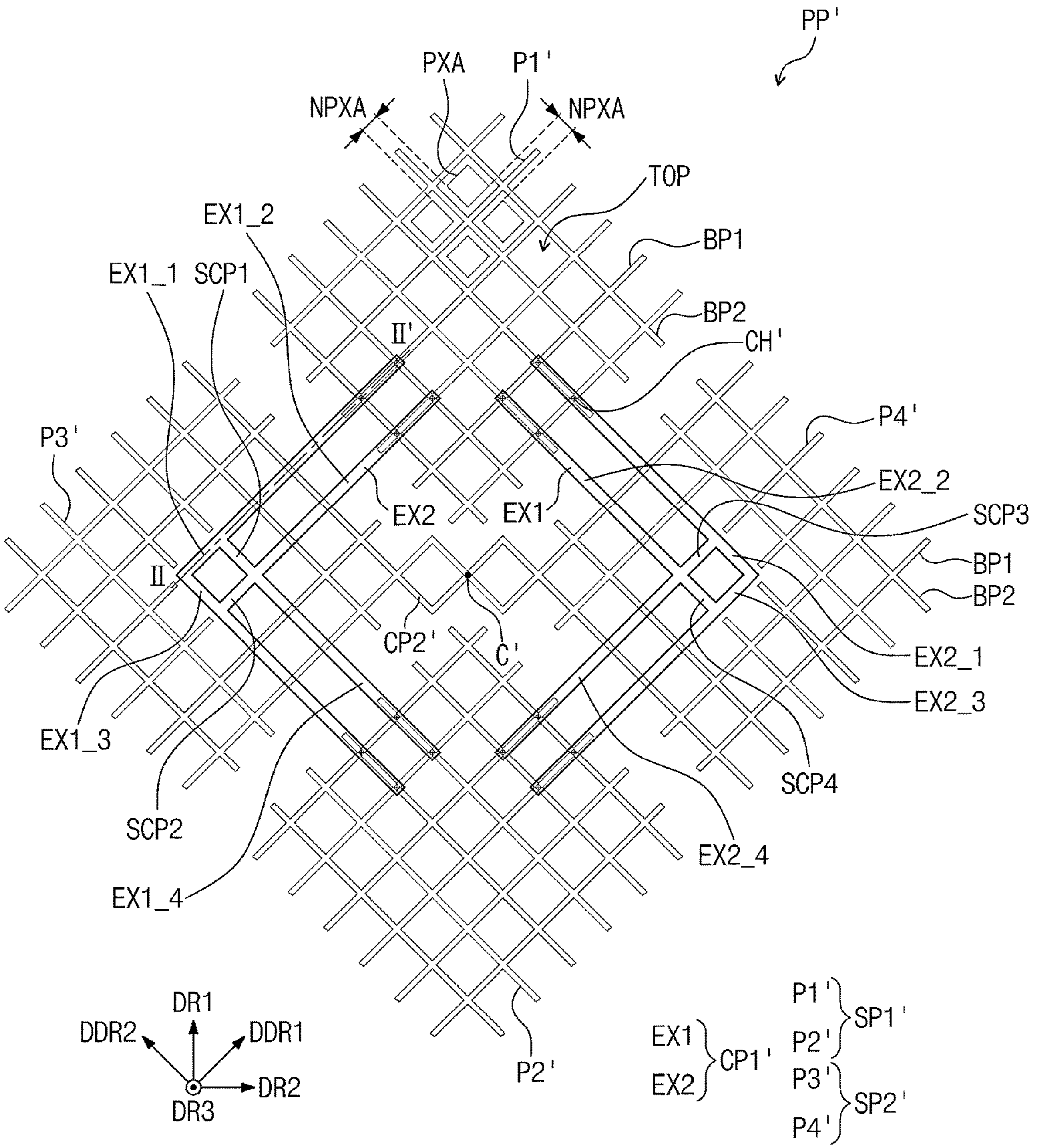
FIG. 5C is an enlarged plan view illustrating patterns on a portion of the area AA' of FIG. 4 according to an embodiment of the inventive concept.
Figure 5D:
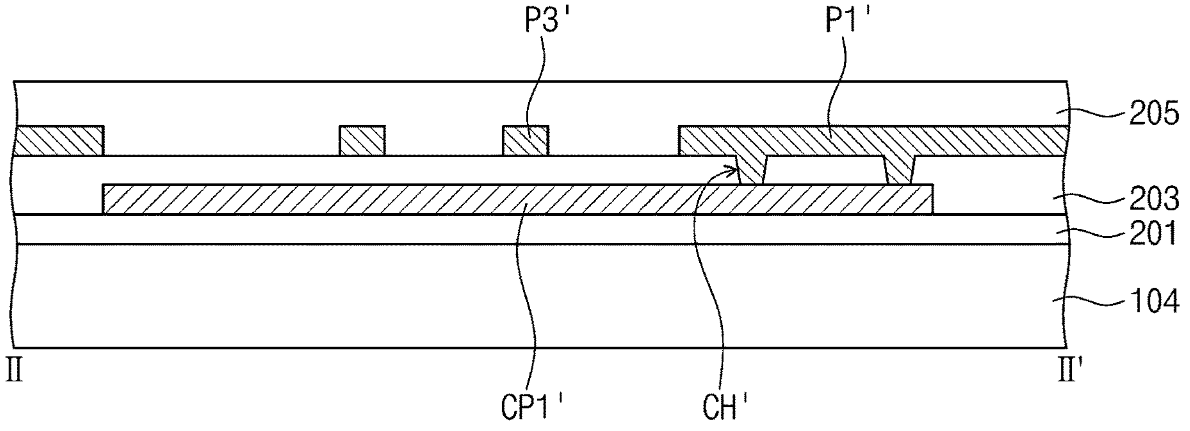
FIG. 5D is a cross-sectional view illustrating the input sensing part, taken along line II-II' of FIG. 5C according to an embodiment of the inventive concept.

FIG. 5C is an enlarged plan view illustrating patterns on a portion of an area AA' of FIG. 4, according to an embodiment of the inventive concept. FIG. 5D is a cross-sectional view illustrating the input sensing part, taken along lie II-II' of FIG. 5C, according to an embodiment of the inventive concept.

Referring to FIGS. 5C and 5D, in an embodiment of the inventive concept, each of first and second sensing patterns SP1' and SP2' may have a mesh shape. Thus, each of the first and second sensing patterns SP1' and SP2' may include a plurality of first branch parts BP1 extending in a first diagonal direction DDR1 and a plurality of second branch parts BP2 extending in a second diagonal direction DDR2. The first diagonal direction DDR1 may be defined as a direction crossing the first and second directions DR1 and DR2 on a plane defined by the first and second directions DR1 and DR2. The second diagonal direction DDR2 may be defined as a direction crossing the first diagonal direction DDR1 on the plane defined by the first and second directions DR1 and DR2. For example, the first direction DR1 and the second direction DR2 may perpendicularly cross each other, and the first diagonal direction DDR1 and the second diagonal direction DDR2 may perpendicularly cross each other.

In an embodiment, the first sensing patterns SP1' may include a first pattern P1' and a second pattern P2', each of which has a mesh shape, and the second sensing patterns SP2' may include a third pattern P3' and a fourth pattern P4' each of which has a mesh shape. The first pattern P1', second pattern P2', third pattern P3', and a fourth pattern P4' can each be in a quadrant of a square or rectangle. Each of the first to fourth patterns P1' to P4' may include first branch parts BP1 and second branch parts BP2, where the first branch parts BP1 and second branch parts BP2 may intersect.

In various embodiments, the first branch parts BP1 of each of the first and second sensing patterns SP1' and SP2' may intersect the second branch parts SP2 of each of the first and second sensing patterns SP1' and SP2', and then, the first branch parts BP1 and the second branch parts BP2 may be integrated with each other. Rhombus-shaped touch openings TOP may be defined by the first branch parts BP1 and the second branch parts BP2, where a touch opening TOP may be defined by two first branch parts BP1 and two second branch parts BP2 intersecting at the corners of the rhombus.

When viewed on the plane, the emission areas PXA may be disposed in the touch openings TOP, where the emission areas PXA may be surrounded by the intersecting two first branch parts BP1 and two second branch parts BP2. Each of the emission areas PXA may be the emission area PXA illustrated in FIG. 3, where an underlying light emitting element 100PE in the light emitting element layer 103 can be aligned with a touch opening TOP in the overlying input sensing part ISP. For example, four emission areas PXA disposed on one first sensing pattern SP1' are illustrated, but a plurality of emission areas PXA may be disposed in a plurality of the touch openings TOP, respectively.

In various embodiments, each of the emission areas PXA may have a rhombus shape, but the shape of each of the emission areas PXA is not limited thereto. The first and second branch parts BP1 and BP2 may overlap the non-emission area NPXA.

In an embodiment, the touch sensor TS may include a plurality of patterns PP', including the first connection pattern CP1' and the second connection pattern CP2'. The first connection pattern CP1' may include a first extension part EX1 and a second extension part EX2. The second sensing patterns SP2' and the second connection pattern CP2' may each have a mesh shape, where the second connection pattern CP2' may be integrated with second sensing patterns SP2'. The first connection pattern CP1' may extend along directions DDR1 and DDR2 to electrically connect the first pattern P1' and the second pattern P2' of the first sensing pattern SP1', and so as not to overlap the second connection pattern CP2'. The first connection pattern CP1' may be disposed not to cross the second connection pattern CP2'. The first connection pattern CP1' may extend toward the first sensing patterns SP1' via areas overlapping the second sensing patterns SP2'. The first connection pattern CP1' may be connected to the first sensing patterns SP1' through a plurality of contact holes CH'.

In various embodiments, the first connection pattern CP1' may include a first extension part EX1 and a second extension part EX2 having a shape that is symmetrical to the first extension part EX1. The second connection pattern CP2' may be disposed between the first extension part EX1 and the second extension part EX2. The first extension part EX1 may extend via an area of the second sensing patterns SP2', which overlaps the third pattern P3'. The second extension part EX2 may extend via an area of the second sensing patterns SP2', which overlaps the fourth pattern P4'.

The first extension part EX1 may include first and second sub extension parts EX1_1 and EX1_2 extending in the first diagonal direction DDR1, third and fourth sub extension parts EX1_3 and EX1_4 extending in the second diagonal direction DDR2, a first sub conductive pattern SCP1 extending in the second diagonal direction DDR2, and a second sub conductive pattern SCP2 extending in the first diagonal direction DDR1.

Predetermined portions of the first and second sub extension parts EX1_1 and EX1_2 may be connected to the first pattern P1' through the plurality of contact holes CH'. Predetermined portions of the third and fourth sub extension parts EX1_3 and EX1_4 may be connected to the second pattern P2' through the contact holes CH'.

The other side of the first sub extension part EX1_1 may extend from the other side of the third sub extension part EX1_3, and the second sub extension part EX1_2 may extend from the other side of the fourth sub extension part EX1_4. The first sub conductive pattern SCP1 may extend from the other side of the fourth sub extension part EX1_4 in the second diagonal direction DDR2 and extend to the first sub extension part EX1_1. The second sub conductive pattern SCP2 may extend from the other side of the second sub extension part EX1_2 in a direction opposite to the first diagonal direction DDR1 and then extend to the third sub extension part EX1_3.

The first sub extension part EX1_1, the second sub extension part EX1_2, the third sub extension part EX1_3, the fourth sub extension part EX1_4, the first sub conductive pattern SCP1, and the second sub conductive pattern SCP2 may be integrated with each other to form a partial mesh.

The first and second sub extension parts EX1_1 and EX1_2 may extend across portions of the second branch parts BP2 of the third pattern P3'. The first branch parts BP1 of the third pattern P3' may not be disposed on partial areas overlapping the first and second sub extension parts EX1_1 and EX1_2 and the second sub conductive pattern SCP2.

The third and fourth sub extension parts EX1_3 and EX1_4 may cross portions of the first branch parts BP1 of the third pattern P3'. The second branch parts BP2 of the third pattern P3' may not be disposed on partial areas overlapping the third and fourth sub extension parts EX1_3 and EX1_4 and the first sub conductive pattern SCP1.

The second extension part EX2 may include fifth and sixth sub extension parts EX2_1 and EX2_2 extending in the second diagonal direction DDR2, seventh and eighth sub extension parts EX2_3 and EX2_4 extending in the first diagonal direction DDR1, a third sub conductive pattern SCP3 extending in the first diagonal direction DDR1, and a fourth sub conductive pattern SCP4 extending in the second diagonal direction DDR2.

The fourth pattern P4' may have a structure symmetrical to the third pattern P3', and the second extension part EX2 may have a structure symmetrical to the first extension part EX1. Therefore, descriptions of the fifth to eighth sub extension parts EX2_1 to EX2_4 and the third and fourth sub conductive patterns SCP3 and SCP4 are similar to those of the third pattern P3' and first to fourth sub extension parts EX1_1 and EX1_4.

The second connection pattern CP2' may be disposed between the first sensing patterns SP1' and may extend between the fourth pattern P4' and the third pattern P3' of the second sensing patterns SP2', where the second sensing patterns SP2' and the second connection pattern CP2' may be integrated with each other. The second connection pattern CP2' may have a mesh shape that is connected to the mesh shapes of the fourth pattern P4' and the third pattern P3'. A central point C' may be defined in the second connection pattern CP2'.

Referring to FIGS. 5C and 5D, the first connection pattern CP1' may be disposed on a base layer 201 and covered by the first insulating layer 203. The first pattern P1' of the first sensing patterns SP1' and the third pattern P3' of the second sensing patterns SP2' may be disposed on the first insulating layer 203 and may be covered by the second insulating layer 205. As illustrated in FIG. 5D, a portion of the first connection pattern CP1' (e.g., the first extension EX1) may be formed with and cross a portion of the third pattern P3' (e.g., the second branch parts BP2 of the third pattern P3'). The first connection pattern CP1' may be connected to the first pattern P1' through the contact holes CH' defined in the first insulating layer 203, where the first and second sub extension parts EX1_1 and EX1_2 may be connected to the first pattern P1' through the plurality of contact holes CH'. FIG. 5D representatively illustrates a portion of the first extension part EX1 of the first connection pattern CP1', and the description thereof may be similarly applied to the second extension part EX2 of the first connection pattern CP1'.

Figure 5E:
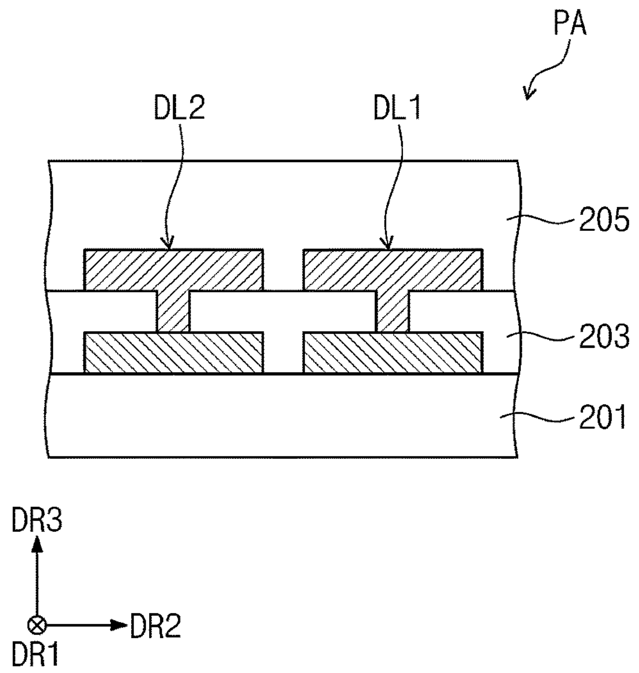
FIGS. 5E and 5F are enlarged cross-sectional views illustrating a portion of an area of the input sensing part according to an embodiment of the inventive concept.
Figure 5F:
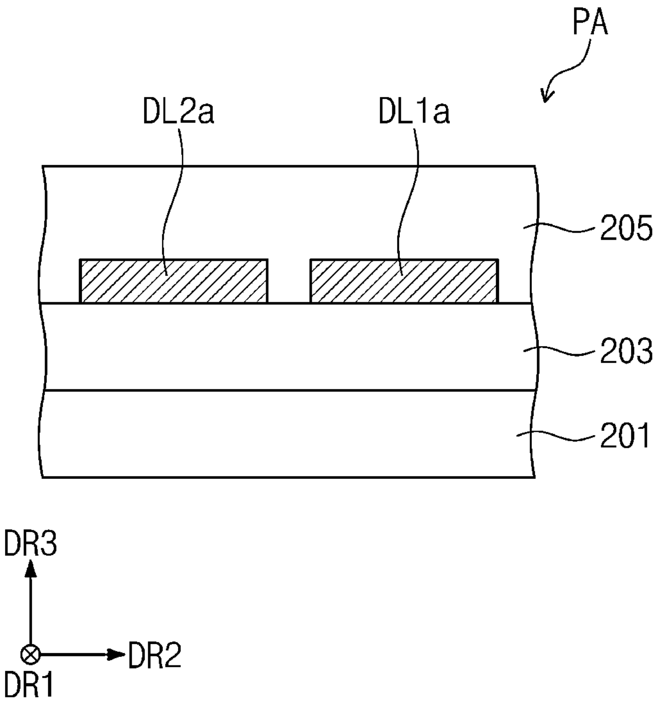

FIGS. 5E and 5F are enlarged cross-sectional views illustrating a portion of an area of the input sensing part according to an embodiment of the inventive concept. FIGS. 5E and 5F are enlarged views illustrating a portion of the area, on which the driving lines DL (see FIG. 4) are disposed, on the peripheral area PA (see FIG. 4).

FIG. 5E representatively illustrates a cross-sections of one first driving line DL1 and one second driving line DL2 of the driving lines DL (see FIG. 4).

Referring to FIGS. 3 and 5E, in this embodiment, each of one first driving line DL1 and one second driving line DL2 may include a plurality of layers. For example, each of one first driving line DL1 and one second driving line DL2 may include a first layer line provided from the first conductive layer 202 and disposed between the base layer 201 and the first insulating layer 203 and a second layer line provided from the second conductive layer 204 and disposed between the first insulating layer 203 and the second insulating layer 205, and the first layer line and the second layer line may be electrically connected to each other. When each of the one first driving line DL1 and the one second driving line DL2 includes a plurality of layers, resistance thereof may more decrease.

FIG. 5F representatively illustrates a cross-section of one first driving line DL1*a* and one second driving line DL2*a* of the driving lines DL (see FIG. 4).

Referring to FIGS. 3 and 5F, in this embodiment, one first driving line DL1*a* and one second driving line DL2*a* may be provided from the second conductive layer 204 and disposed between the first insulating layer 203 and the second insulating layer 205, where the second insulating layer 205 can cover the first driving line DL1*a* and the second driving line DL2*a*. However, the embodiment of the inventive concept is not limited thereto. One first driving line DL1*a* and one second driving line DL2*a* may be provided from the first conductive layer 202 and disposed between the base layer 201 and the first insulating layer 203.

In another embodiment, a portion of the driving lines DL (see FIG. 4) may have a multi-layer structure as illustrated in FIG. 5E, and another portion of the driving lines DL may have a single-layer structure as illustrated in FIG. 5F. In addition, in another embodiment, a portion of the driving lines DL may be provided from the first conductive layer 202 and disposed between the base layer 201 and the first insulating layer 203, another portion of the driving lines DL may be provided from the second conductive layer 204 and disposed between the first insulating layer 203 and the second insulating layer 205.

FIGS. 6A to 6I are plan views illustrating a touch area TA of a touch sensing unit according to an embodiment of the inventive concept.

Figure 6A:
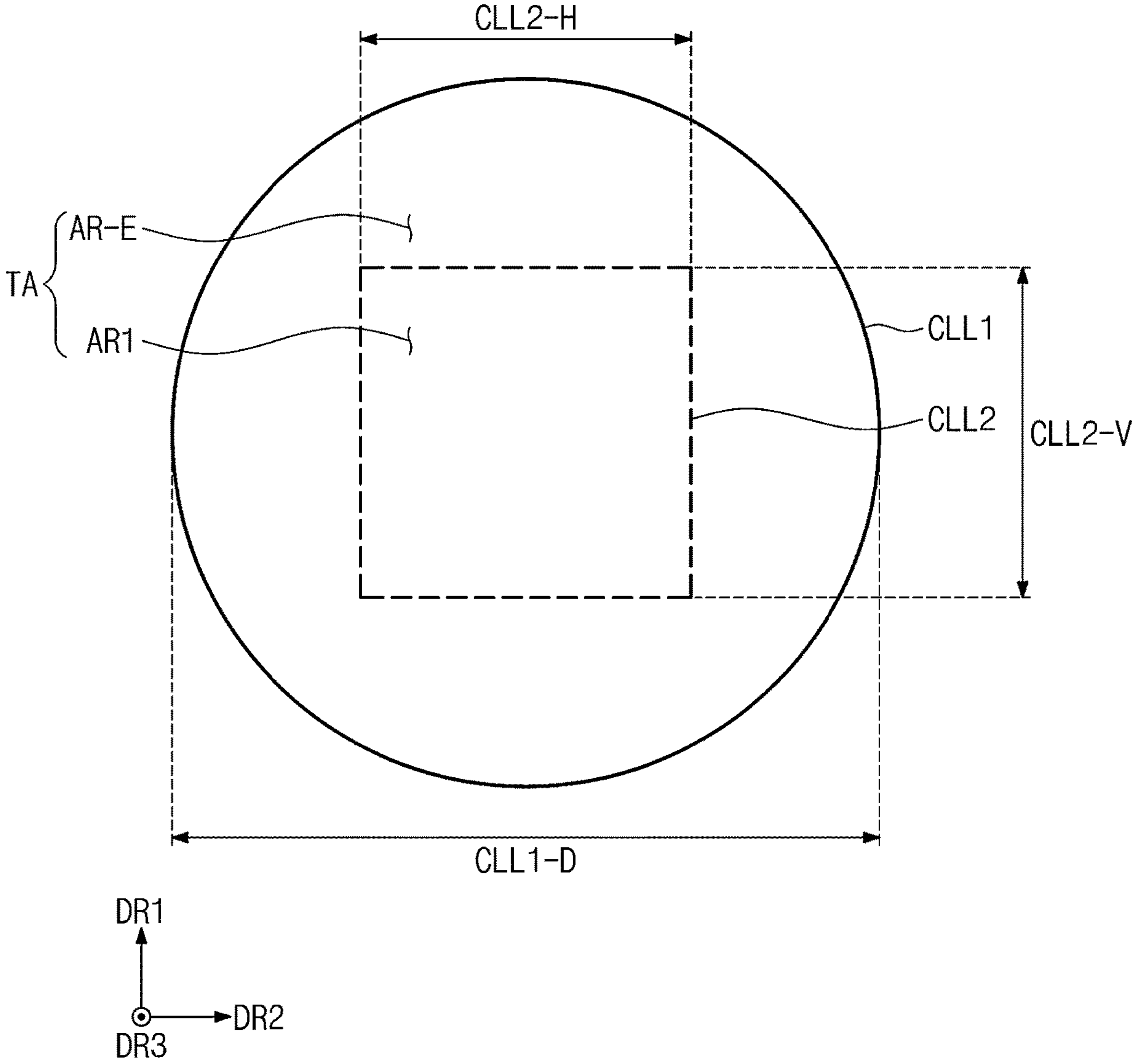
FIGS. 6A to 6I are detailed plan views illustrating a touch area of the input sensing part according to an embodiment of the inventive concept.

In FIG. 6A, a touch area TA is illustrated. The touch area TA is defined by the first closed line CLL1, where the touch area TA may include a center area AR1 and an outer area AR-E on a plane. The center area AR1 and the outer area AR-E may be divided by the second closed line CLL2, where the boundary of the center area AR1 is delineated by the second closed line CLL2, which may be square or rectangular. In FIG. 6A, the first closed line CLL1 is illustrated by a solid line, and the second closed line CLL2 is illustrated by a dotted line.

The first closed-line CLL1 is illustrated as a circle having a predetermined diameter CLL1-D. Thus, a shape of the touch area TA may correspond to a circular shape having a diameter CLL1-D.

The second closed line CLL2 may be defined within the touch area TA. The second closed line CLL2 may have a rectangular shape constituted by two horizontal sides CLL2-H extending in the second direction DR2 and two vertical sides CLL2-V extending in the first direction DR1. An outer line of the center area AR1 may be defined by a second closed line CLL2.

The outer area AR-E may be defined as the area other than the center area AR1 of the touch area TA. The outer area AR-E may correspond to an area between the second and first closed lines CLL2 and CLL1.

Figure 6B:
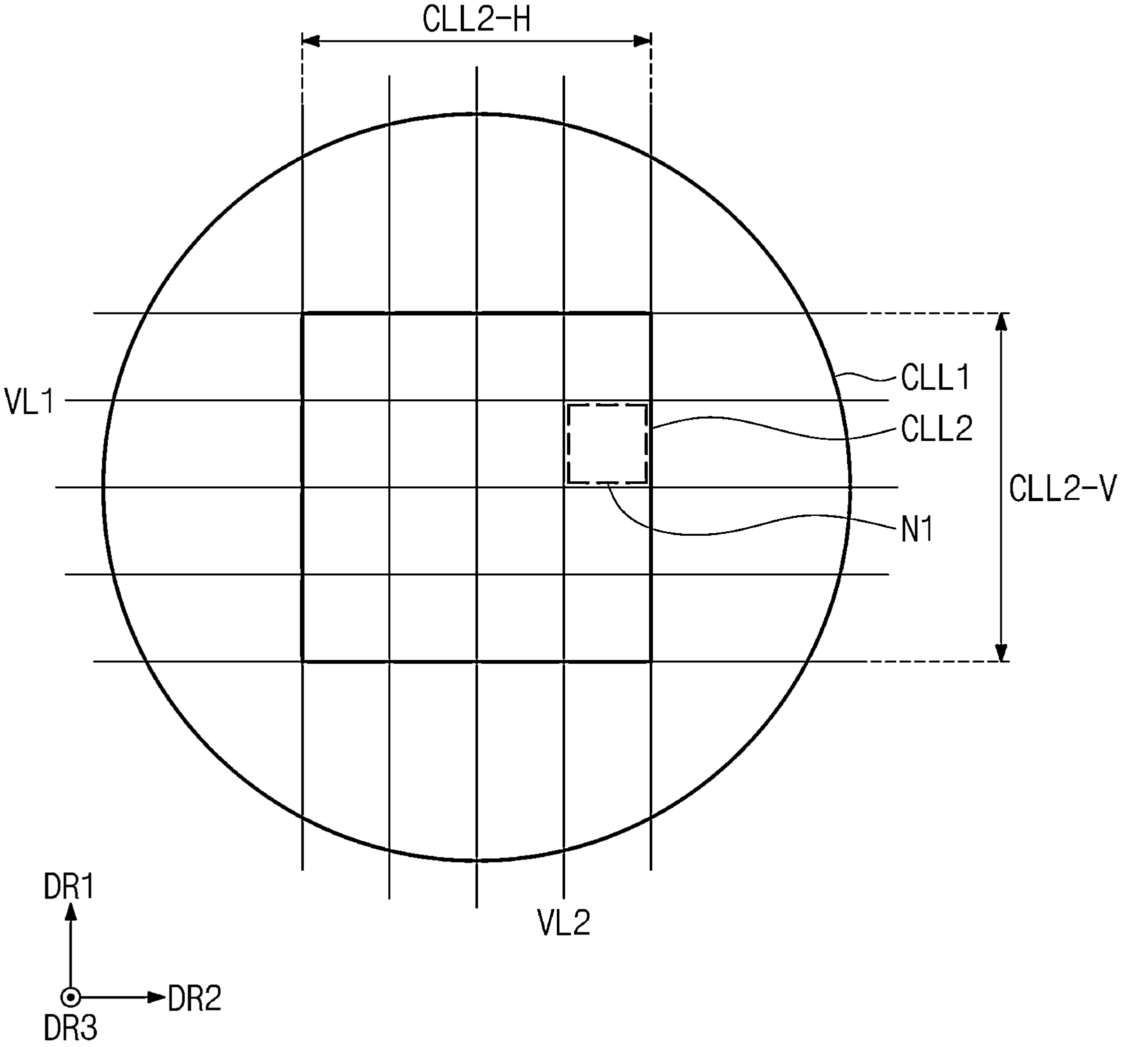

Then, as illustrated in FIG. 6B, predetermined virtual lines may be defined on the touch area TA (see FIG. 6A). The virtual lines may include a plurality of first virtual lines VL1 and a plurality of second virtual lines VL2. Each of the first virtual lines VL1 may extend in the second direction DR2 and may be arranged and spaced apart in the first direction DR1. Each of the second virtual lines VL2 may extend in the first direction DR1 and may be arranged and spaced apart in the second direction DR2. The second virtual lines VL2 may cross the first virtual lines VL1 to form adjoining square or rectangular areas.

In this embodiment, the first virtual lines VL1 and the second virtual lines VL2 may be provided in the same number. However, this is illustrated as an example, and the number of each of the first virtual lines VL1 and the second virtual lines VL2 may be determined independently of each other, and is not limited to any one embodiment.

The first virtual lines VL1 and the second virtual lines VL2 may divide the center area AR1 (see FIG. 6A) into a plurality of areas. The first virtual lines VL1 and the second virtual lines VL2 may divide the center area AR1 into a plurality of nodes N1 arranged in a matrix shape defined by the first direction DR1 and the second direction DR2.

The first nodes N1 may have the same shape and area as each other. In various embodiments, each of the first nodes N1 may have a square shape or a rectangular shape. A first node N1 can be in each of the plurality of the divided areas of the center area AR1. A shape of each of the first nodes N1 may vary according to a spaced distance between the first virtual lines VL1 and the second virtual lines VL2 and a distribution density of the first virtual lines VL1 and the second virtual lines VL2.

Figure 6C:
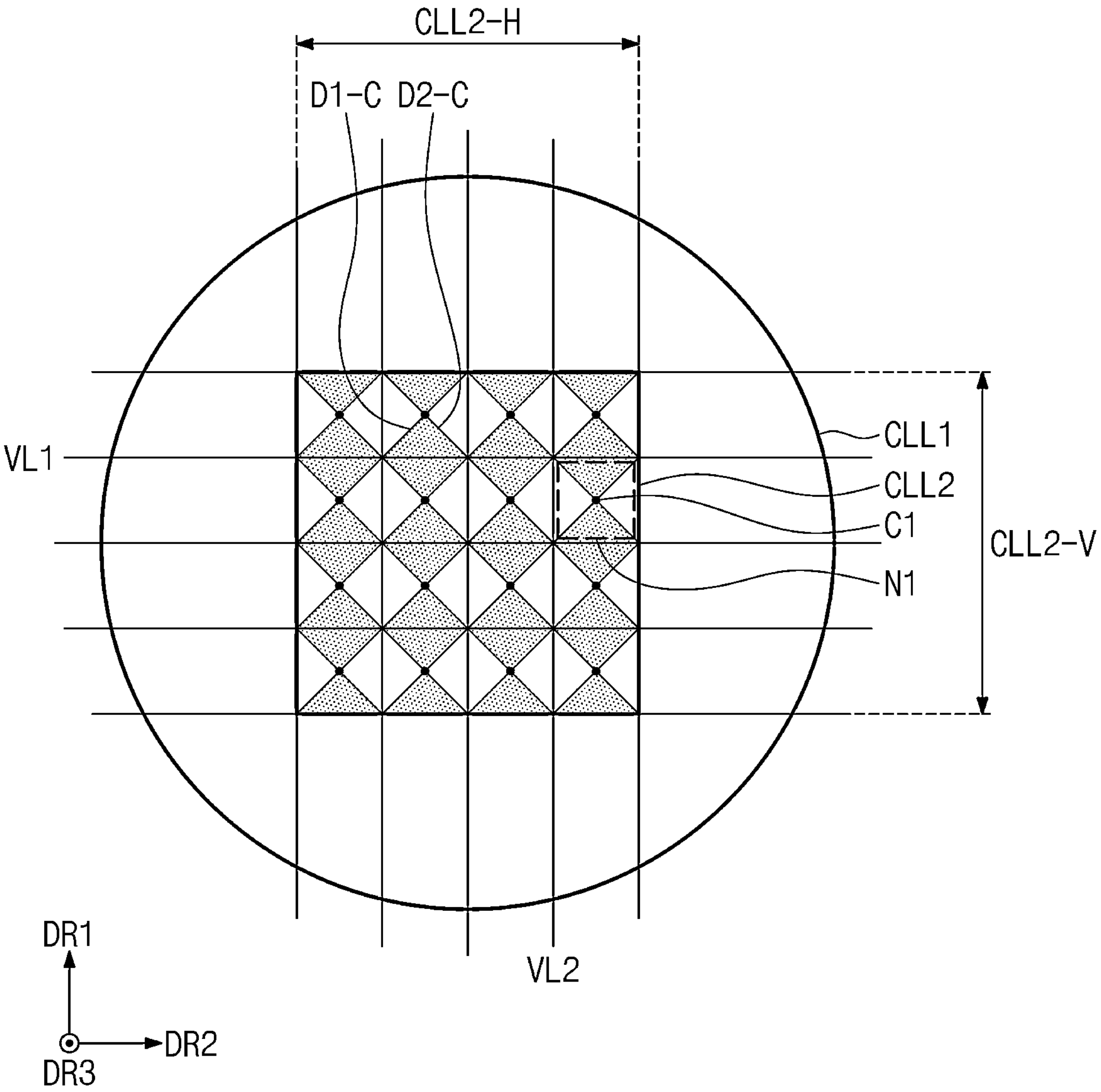

Then, as illustrated in FIG. 6C, the first to fourth patterns P1 to P4 (see FIG. 5A) constituting each of the first nodes N1 may be defined through diagonals (hereinafter, referred to central diagonals D1-C and D2-C) of each of the first nodes N1. The central diagonals D1-C and D2-C defined in each of the first nodes N1 may be boundaries between the first to fourth patterns P1 to P4 (see FIG. 5A) provided in the first nodes N1. The central diagonals D1-C and D2-C can partition the divided areas of the center area AR1 into adjoining triangular areas.

The central diagonals D1-C and D2-C may include first central diagonals D1-C and second central diagonals D2-C respectively crossing the first central diagonals D1-C. A planar shape of each of the first to fourth patterns P1 to P4 (see FIG. 5A) provided in each of the first nodes N1 may be defined by the first central diagonals D1-C and the second central diagonals D2-C.

As the first nodes N1 have the same shape and area as each other, the first patterns P1 disposed in the first nodes N1 (see FIG. 5A) may have the same size and shape as each other, and the second patterns P2 (see FIG. 5A) disposed in the fields N1 may have the same size and shape as each other. The first patterns P1 (see FIG. 5A) and the second patterns P2 (see FIG. 5A) disposed in the first nodes N1 may have symmetrical shapes and have the same area.

In addition, the third patterns P3 (see FIG. 5A) disposed within the first nodes N1 may have the same size and shape as each other, and the fourth patterns P4 (see FIG. 5A) disposed within the first nodes N1 may have the same size and shape as each other. The third patterns P3 (see FIG. 5A) and the fourth patterns P4 (see FIG. 5A) disposed in the first nodes N1 may have symmetrical shapes and have the same area.

In an embodiment, central points (hereinafter, referred to as first central points C1) may be defined in each of the plurality of first nodes N1. Each of the first central points C1 may correspond to the central point C described above with reference to FIG. 5A. The first central points C1 may be arranged in the first direction DR1 and the second direction DR2 according to the arrangement direction of the first nodes N1. The first central points C1 may be located at the intersection of the central diagonals D1-C and D2-C.

Figure 6D:
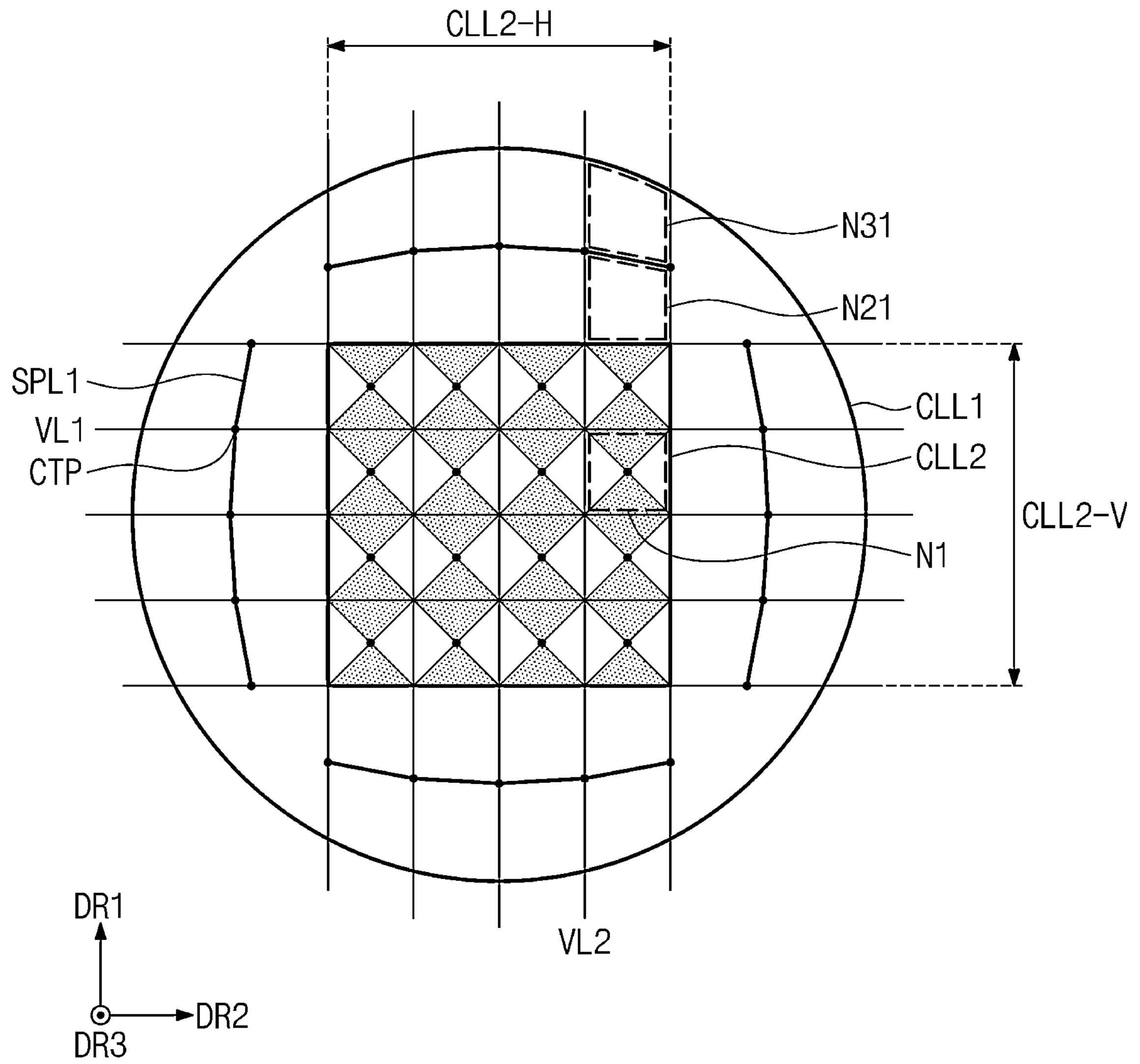

Then, as illustrated in FIG. 6D, at least one first division line SPL1 may be defined within the outer area AR-E (see FIG. 6A). FIG. 6D illustrates four first division lines SPL1 for each of the four sides of center area AR1, and which respectively face each of the two horizontal sides CLL2-H and the two vertical sides CLL2-V.

Each of the first division lines SPL1 may substantially face the horizontal side CLL2-H or the vertical side CLL2-V of the second closed line CLL2. The first division lines SPL1 facing the horizontal sides CCL2-H may extend between two adjacent second virtual lines VL2, where each first division line SPL1 can extend from a first central point CTP located along an initial second virtual lines VL2 to a second central point CTP located along a subsequent second virtual lines VL2 adjacent to the initial second virtual lines VL2. The first division lines SPL1 facing the vertical sides CCL2-V may extend between two adjacent first virtual lines VL1, where each first division line SPL1 can extend from a first central point CTP located along an initial first virtual line VL1 to a second central point CTP located along a subsequent first virtual line VL1 adjacent to the initial first virtual line VL1.

Central points CTP may be defined along each of the first virtual lines VL1. One central point CTP may be defined at a center of a portion overlapping the outer area AR-E (see FIG. 6A) of one first virtual line VL1. Two central points CTP spaced apart from each other in the second direction DR2 may be defined on one first virtual line VL1 with the center area AR1 (see FIG. 6A) located therebetween. The central point CTP can be located half of the distance between a facing segment of the first closed line CLL1 and the vertical side CLL2-V proximal to the facing segment of the first closed line CLL1, where the length of the first virtual line VL1 on opposite sides of the central point CTP can be equal.

The central points CTP may also be defined along each of the second virtual lines VL2. One central point CTP may be defined at a center of a portion overlapping the outer area AR-E (see FIG. 6A) of one second virtual line VL2. The two central points CTP spaced apart from each other in the first direction DR1 may be defined on one second virtual line VL2 with the center area AR1 (see FIG. 6A) located therebetween. The central point CTP can be located half of the distance between a facing segment of the first closed line CLL1 and the horizontal side CLL2-H proximal to the facing segment of the first closed line CLL1, where the length of the second virtual line VL2 on opposite sides of the central point CTP can be equal.

Each of the first division lines SPL1 may be formed by connecting the central points CTP to each other, where the first division lines SPL1 may span the distance between two central points CTP on adjacent first virtual lines VL1 or adjacent second virtual lines VL2. Specifically, each of the first division lines SPL1 facing the vertical sides CLL2-V may connect the central points CTP defined on the first virtual lines VL1 to each other to cross the first virtual lines VL1. Each of the first division lines SPL1 facing the horizontal sides CLL2-H may connect the central points CTP defined on the second virtual lines VL2 to each other to cross the second virtual lines VL2.

As the first division lines SPL1 extend to connect the central points CTP to each other, at least a portion of each of the first division lines SPL1 may not be parallel with a facing side among sides of the second closed line CLL2. That is, at least a portion of each of the first division lines SPL1 may extend in a direction different from the extending direction of the facing side among the sides of the second closed line CLL2. Specifically, at least a portion of each of the first division lines SPL1 facing the vertical sides CLL2-V may extend in a direction different from the first direction DR1, and at least a portion of each of the first division lines SPL1 facing the horizontal sides CLL2-H may extend in a direction different from the second direction DR2. A first division line SPL1 may not be parallel with either the facing vertical sides CLL2-V or the facing horizontal sides CLL2-H of the second closed line CLL2.

In various embodiments, a plurality of (2-1)-th nodes N21 and a plurality of (3-1)-th nodes N31 may be arranged along the first division lines SPL1 within the areas between the first virtual lines VL1 facing each other or the areas between the second virtual lines VL2 facing each other within the outer areas AR-E (see FIG. 6A). The (3-1)-th nodes N31 may be the outermost nodes within the touch area TA (see FIG. 6A), and the (2-1)-th nodes N21 may be nodes disposed between the center area AR1 (see FIG. 6A) and the division lines SPL1 delineating the (3-1)-th nodes N31, where the first division line SPL1 may coincide with boundaries of the (2-1)-th and (3-1)-th nodes N21 and N31 adjacent to each other.

Figure 6E:
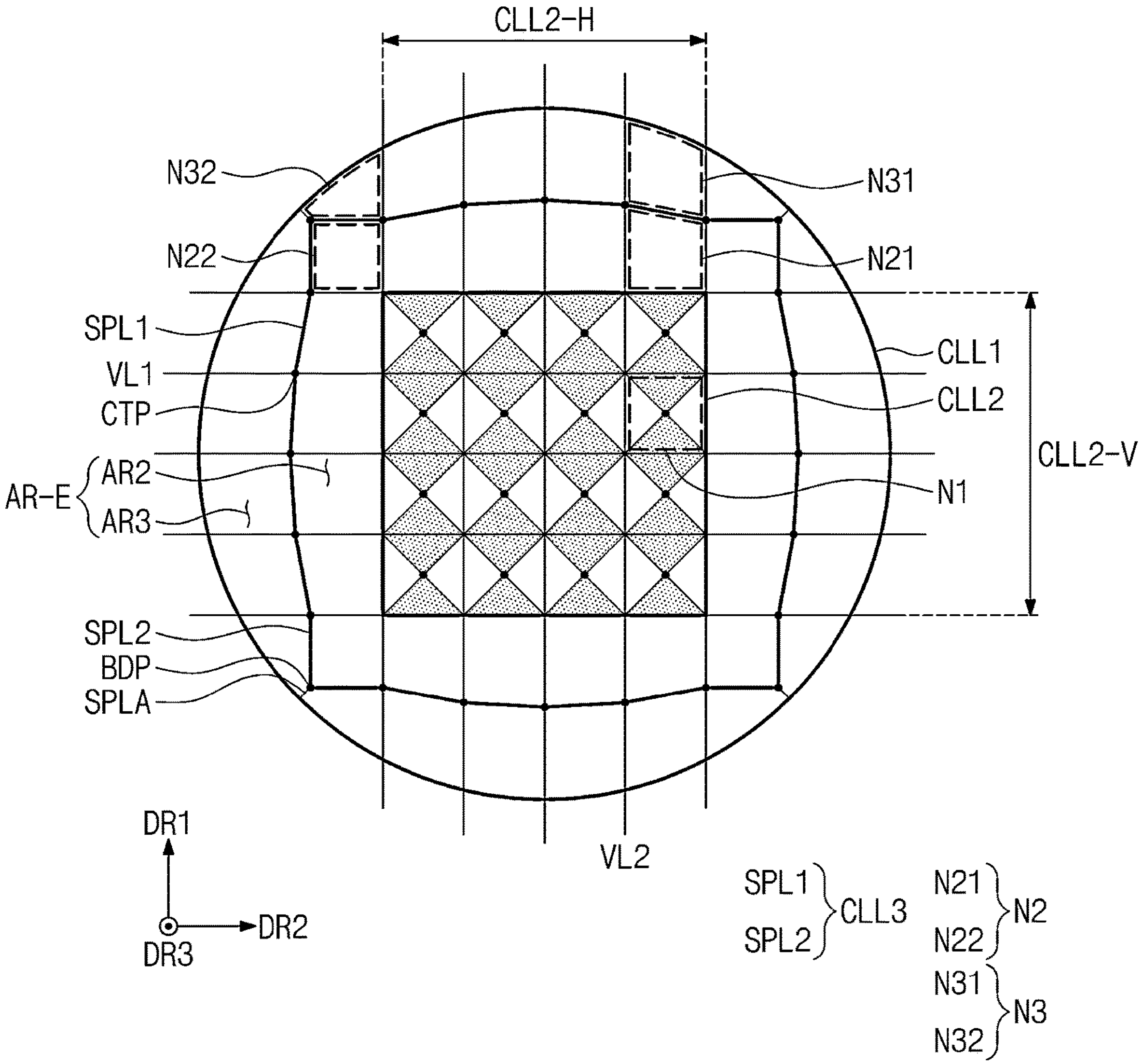

In various embodiments, the (2-1)-th nodes N21 may correspond to the second nodes adjacent to the first division lines SPL1 among the second nodes N2 (see FIG. 6E), and the (3-1)-th nodes N31 may correspond to the third nodes adjacent to the first division lines SPL1 among the third nodes N3 (see FIG. 6E). The first nodes N1 can be within the first area AR1, the second nodes N2 can be within the second area AR2, and the third nodes N3 can be within the third area AR3, where the input sensing part can include first to third nodes, which are disposed on the first to third areas, respectively.

Specifically, some of the (2-1)-th nodes N21 may be bordered by the vertical side CCL2-V, the first division line SPL1 facing the vertical side CCL2-V, and the first virtual lines VL1 crossing the vertical side CCL2-V and facing each other. Other portions of the (2-1)-th nodes N21 may be bordered by the horizontal side CCL2-H, the first division line SPL1 facing the horizontal side CCL2-H, and the second virtual lines VL2 crossing the horizontal side CCL2-H and facing each other.

Each of the (2-1)-th nodes N21 may have a quadrangular shape. In the four sides of each of the (2-1)-th nodes N21, two sides parallel to the first virtual lines VL1 or two sides parallel to the second virtual lines VL2 may be parallel to each other. In the four sides of each of the (2-1)-th nodes N21, a side parallel to the second closed line CLL2 and a side parallel to the first division line SPL1 may extend in different directions. Each of the (2-1)-th nodes N21 may include two facing sides extending in different directions.

Each of the (2-1)-th nodes N21 may have an asymmetrical shape around a diagonal connecting two vertexes facing each other. In addition, each of the (2-1)-th nodes N21 may have a shape different from that of each of the first nodes N1.

Some of the (3-1)-th nodes N31 may be surrounded by the first division line SPL1 facing the vertical side CLL2-V, the first virtual lines VL1 crossing the vertical side CLL2-V, and a portion of the first closed line CCL1 connecting the first virtual lines VL1 to each other. Other portions of the (3-1)-th nodes N31 may be surrounded by the first division line SPL1 facing the horizontal side CLL2-H, the second virtual lines VL2 crossing the horizontal side CLL2-H, and a portion of the first closed line CCL1 connecting the second virtual lines VL2 to each other.

Each of the (3-1)-th nodes N31 may include four sides. In the four sides of each of the (3-1)-th nodes N31, two sides parallel to the first virtual lines VL1 or two sides parallel to the second virtual lines VL2 may be parallel to each other. In the four sides of each of the (3-1)-th nodes N31, a side parallel to the first closed line CCL1 may have a curvature. That is, each of the (3-1)-th nodes N31 may include a side having a curvature. Thus, in the four sides of each of the (3-1)-th nodes N31, the side parallel to the first closed line CCL1 and the side parallel to the first division line SPL1 may not be parallel to each other.

Each of the (3-1)-th nodes N31 may have an asymmetrical shape around a diagonal connecting two vertexes facing each other. In addition, each of the (3-1)-th nodes N31 may have a shape different from that of each of the first nodes N1 and the (2-1)-th nodes N21.

Then, as illustrated in FIG. 6E, at least one second division line SPL2 may be defined within the outer area AR-E. FIG. 6E illustrates that four second division lines SPL2 connecting adjacent first division lines SPL1 to each other among the four first division lines SPL1 described in FIG. 6D are defined as an example.

Each of the second division lines SPL2 is surrounded by virtual lines crossing each other among first virtual lines VL1 disposed at both ends and second virtual lines VL2 disposed at both ends in the outer area AR-E.

In this embodiment, the first division lines SPL1 and the second division lines SPL2 may be connected to each other to define one third closed line CLL3. The third closed line CLL3 may divide the outer area AR-E (see FIG. 6A) into a second area AR2 and a third area AR3. The first to third areas AR1 to AR3 can be within the first closed line CLL1 and overlap the active area DA of the electronic device 1000.

Each of the second division lines SPL2 may include a bending point BDP, where each of the second division lines SPL2 may have a shape bent at the bending point BDP, where the second division lines SPL2 may change directions at the bending point BDP. A portion of the second division line SPL2 may extend from one end of one of the adjacent first division lines SPL1 to the bending point BDP, and the other portion of the second division line SPL2 may extend from one end of the other of the adjacent first division lines SPL1 to the bending point BDP. The bending point BDP can be in a region bounded by a first virtual line VL1, a second virtual lines VL2, and the first closed line CCL1, where the bending region is external to the first area AR1.

A (2-2)-th node N22 may be defined through each of the second division lines SPL2. Specifically, the (2-2)-th node N22 may be surrounded by the second division line SPL2 and the outermost first and second virtual lines VL1 and VL2 crossing each other. The (2-2)-th nodes N22 may correspond to second nodes, which are adjacent to the second division lines SPL2, of the second nodes N2.

Each of the (2-2)-th nodes N22 may include four sides. Although FIG. 6E illustrates that each of the (2-2)-th nodes N22 has a square shape, this embodiment is not limited thereto. For example, each of the (2-2)-th nodes N22 may be changed in shape according to the shape of each of the second division lines SPL2.

In an embodiment, the second nodes N2 including the (2-1)-th nodes N21 and the (2-2)-th nodes N22 may be disposed on the second area AR2. The second nodes N2 may surround the first nodes N1.

In an embodiment, at least one additional division line SPLA may be further defined on the outer area AR-E. FIG. 6E illustrates that four additional division lines SPLA respectively extend from the second division lines SPL2, as an example.

Each of the additional division lines SPLA may extend from the bending point BDP to the first closed line CCL1, where the additional division lines SPLA may extend from the bending point BDP to the closest point on the first closed line CCL1. In an embodiment, each of the additional division lines SPLA may extend in a direction diagonal to the first and second directions DR1 and DR2.

A (3-2)-th node N32 may be defined through each of the additional division lines SPLA. Specifically, the (3-2)-th nodes N32 may be bordered by the additional division line SPLA, the second division line SPL2, the first closed line CCL1, the first virtual line VL1, or the second virtual line VL2. The (3-2)-th nodes N32 may correspond to third nodes, which are adjacent to the second division line SPL2, of the third nodes N3.

Each of the (3-2)-th nodes N32 may include four sides. As each of the (3-2)-th nodes N32 includes a side parallel to the first closed line CLL1, each of the (3-2)-th nodes N32 may include a side having a curvature.

In this embodiment, the third nodes N3 including the (3-1)-th nodes N31 and the (3-2)-th nodes N32 may be disposed on the third area AR3. The third nodes N3 may surround the second nodes N2.

In this embodiment, each of the (2-2)-th nodes N22 and (3-2)-th nodes N32 may have a surface area that is equal to or greater than about ½ of that of each of the first nodes N1. That is, the second division line SPL2 and the additional division line SPLA may be defined so that a surface area of each of the (2-2)-th nodes N22 and (3-2)-th nodes N32 satisfies the above condition. Also, each of the second nodes N2 may have a surface area equal to or greater than about ½ of that of each of the first nodes N1, and each of the third nodes N3 may have a surface area equal to or greater than about ½ of that of each of the first nodes N1. In this case, touch sensitivity on the outer area AR-E may be prevented from being less than the first area AR1, or the degree to which the touch sensitivity on the outer area AR-E is lowered compared to the first area AR1 may be reduced.

Although FIG. 6E illustrates that the bending point BDP of the second division line SPL2 is disposed within the outer area AR-E, as an example, this embodiment is not limited thereto. In various embodiments, the bending point BDP of the second division line SPL2 may be disposed directly on the first closed line CLL1. Here, the additional division line SPLA may be omitted, and each of the (3-2)-th nodes N32 may include only three sides.

Each of the second nodes N2 and the third nodes N3 may include the first to fourth patterns P1 to P4 described above with reference to FIG. 5A, where the first to fourth patterns P1 to P4 constituting each of the first nodes N1 may be defined through central diagonals D1-C and D2-C). A detailed description thereof will be described below with reference to FIGS. 6F to 6I.

Figure 6F:
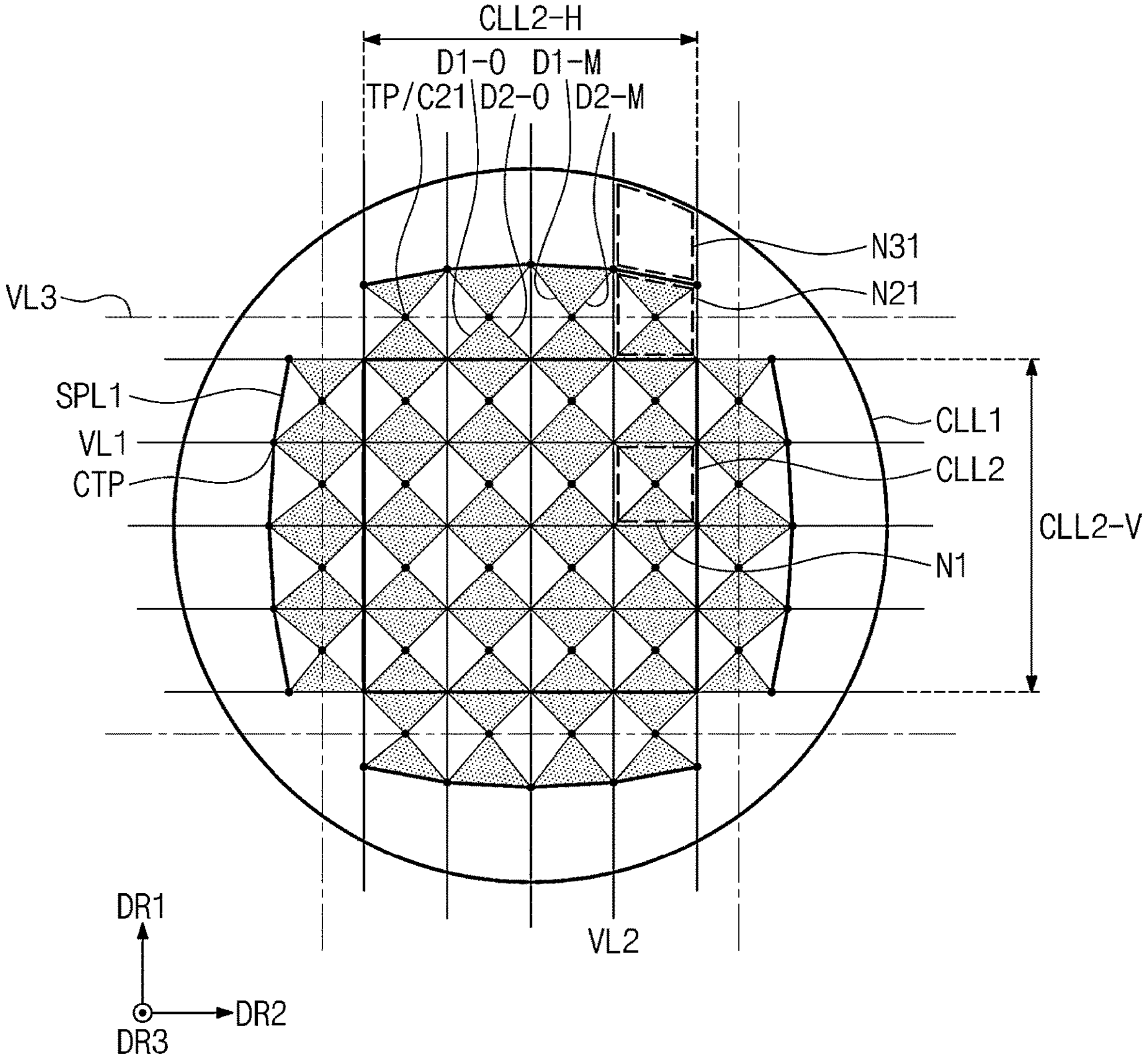

Then, as illustrated in FIG. 6F, the first to fourth patterns P1 to P4 (see FIG. 5A) disposed on each of the (2-1)-th nodes N21 may be defined through first intermediate lines D1-O and D2-O and second intermediate lines D1-M and D2-M, which are defined on the (2-1)-th nodes N21. The first intermediate lines D1-O and D2-O and second intermediate lines D1-M and D2-M may not be symmetrical in the (2-1)-th nodes N21 due to the curvature of a first division line SPL1.

The first intermediate lines D1-O and D2-O may include the (1-1)-th intermediate lines D1-O and the (1-2)-th intermediate lines D2-O. The (1-1)-th intermediate lines D1-O and the (1-2)-th intermediate lines D2-O may extend in the same direction as the first central diagonals D1-C (see FIG. 6C) and the second central diagonals D2-C (see FIG. 6C), respectively.

In various embodiments, the virtual lines may further include a plurality of third virtual lines VL3, as shown in FIG. 6F, defined on the outer area AR-E (see FIG. 6A) to cross the outer area AR-E (see FIG. 6A). In an embodiment, two out of the four third virtual lines VL3 may face the horizontal sides CLL2-H to extend in the second direction DR2, and other two of the four third virtual lines VL3 may face the vertical sides CLL2-V to extend in the first direction DR1.

A minimum distance between one third virtual line VL3 and one first virtual line VL1 or one third virtual line VL3 and one second virtual line VL2 may be substantially the same as ½ of each spaced distance of the first virtual lines VL1 or ½ of each spaced distance of the second virtual lines VL2.

Crossing points TP at which the (1-1)-th intermediate lines D1-O and the (1-2)-th intermediate lines D2-O intersect and are in contact with each other may be defined on each of the third virtual lines VL3.

The second intermediate lines D1-M and D2-M may include (2-1)-th intermediate lines D1-M and (2-2)-th intermediate lines D2-M. Each of the (2-1)-th intermediate lines D1-M and the (2-2)-th intermediate lines D2-M may correspond to a line connecting the crossing point TP to an adjacent central point CTP along a diagonal. In one (2-1)-th node N21, each of the (2-1)-th intermediate lines D1-M and the (2-2)-th intermediate lines D2-M, which are in contact with each other through the crossing point TP, may extend in a direction crossing each other toward the adjacent central points CTP.

The (2-1)-th and (2-2)-th intermediate lines D1-M and D2-M may extend in directions different from those of the (1-1)-th and (1-2)-th intermediate lines D1-O and D2-O, respectively. In addition, the (2-1)-th and (2-2)-th intermediate lines D1-M and D2-M may extend in directions different from those of the first and second central diagonals D1-C and D2-C (see FIG. 6C), respectively.

A planar shape of each of the first to fourth patterns P1 to P4 (see FIG. 5A) provided in each of the (2-1)-th nodes N21 may be defined by the (1-1)-th and (1-2)-th intermediate lines D1-O and D2-O and the (2-1)-th and (2-2)-th intermediate lines D1-M and D2-M in the second area AR2.

In the first to fourth patterns P1 to P4 (see FIG. 5A) provided in each of the (2-1)-th nodes N21, one pattern defined by the (1-1)-th and (1-2)-th intermediate lines D1-O and D2-O may have the same shape and area as one of the first to fourth patterns P1 to P4 (see FIG. 5A) disposed in the first nodes N1. That is to say, in one of the first to fourth patterns P1 to P4 (see FIG. 5A) provided in each of the (2-1)-th nodes N21, one pattern adjacent to the second closed line CLL2 may have the same shape and area as one of the first to fourth patterns P1 to P4 (see FIG. 5A) disposed in the N1.

As the first division lines SPL1 may not be parallel to the second closed line CLL2 facing each other, the first and second patterns P1 and P2 (see 5A) provided in the (2-1)-th nods N21 may have shapes asymmetric to each other, and the third and fourth patterns P3 and P4 (see FIG. 5A) provided in each of the (2-1)-th nodes BN21 may have shapes asymmetric to each other.

Figure 6G:
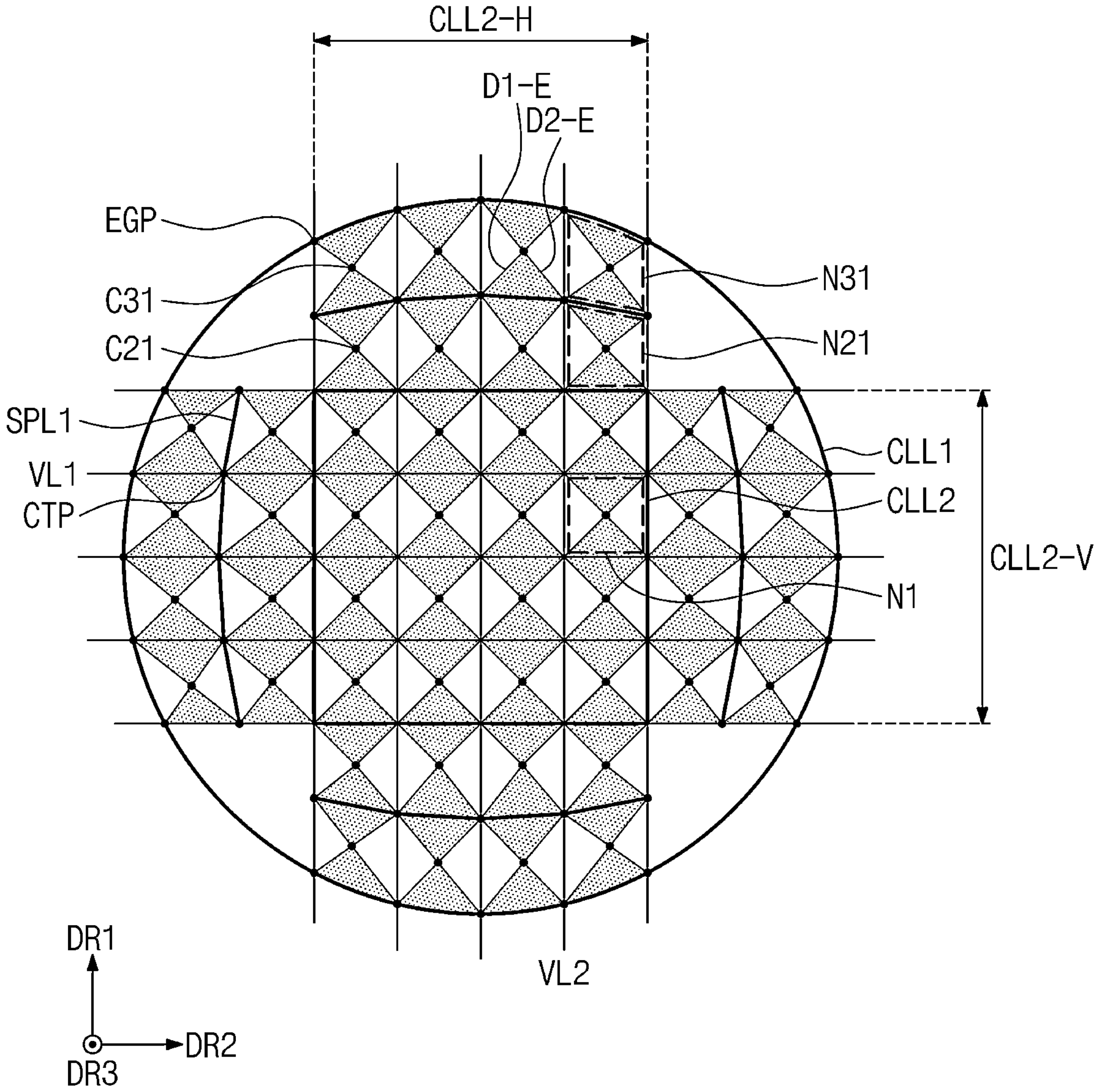

The aforementioned crossing points TP may correspond to central points defined at the (2-1)-th nodes N21 (hereinafter, referred to as (2-1)-th central points C21). Thus, the (2-1)-th central points C21, as shown in FIGS. 6F and 6G, facing the horizontal side CCL2-H may be arranged in the same direction as the extending direction of the horizontal side CCL2-H, and the (2-1)-th central points C21 facing the vertical side CCL2-V may be arranged in the same direction as the extending direction of the vertical side CCL2-V. That is to say, the (2-1)-th central points C21 adjacent to one first division line SPL1 may be arranged in the same direction as the extending direction of a side facing one first division line SPL1 among the sides of the second closed line CLL2.

Then, as illustrated in FIG. 6G, the first to fourth patterns P1 to P4 (see FIG. 5A) disposed in each of the (3-1)-th nodes N31 may be defined through the outer lines D1-E and D2-E defined in the (3-1)-th nodes N31.

Outer points EGP defined by overlapping the first virtual lines VL1 and the second virtual lines VL2 may be defined on the first closed line CLL1. Each of the outer lines D1-E and D2-E may connect the outer point EGP and the central point CTP, which face each other, to each other in a direction crossing the inside of the (3-1)-th node N31. That is, each of the outer lines D1-E and D2-E may correspond to one diagonal of the (3-1)-th node N31.

The outer lines D1-E and D2-E may include first outer lines D1-E and second outer lines D2-E. In one (3-1)-th node N31, one first outer line D1-E and one second outer line D2-E may cross each other. A planar shape of each of the first to fourth patterns P1 to P4 (see FIG. 5A) provided in each of the (3-1)-th nodes N31 may be defined by the first and second outer lines D1-E and D2-E. The first and second patterns P1 and P2 (see FIG. 5A) provided in each of the (3-1)-th nodes N31 have asymmetrical shapes, and the third and fourth patterns P3 and P4 (see FIG. 5A) provided in each of the (3-1)-th nodes N31 may have asymmetric shapes.

Each of central points (hereinafter, referred to as (3-1)-th central points C31) defined in the (3-1)-th nodes N31 may correspond to a point at which the first and second outer lines D1-E and D2-E cross each other. In this embodiment, the (3-1)-th central points C31 facing the horizontal side CLL2-H may be arranged in a direction different from the extending direction of the horizontal side CLL2-H, and the (3-1)-th central points C31 facing the vertical side CLL2-V may be arranged in a direction different from the extending direction of the vertical side CLL2-V. That is to say, the (3-1)-th central points C31 adjacent to one first division line SPL1 may be arranged in a direction different from the extending direction of a side facing one first division line SPL1 among the sides of the second closed line CLL2.

Figure 6H:
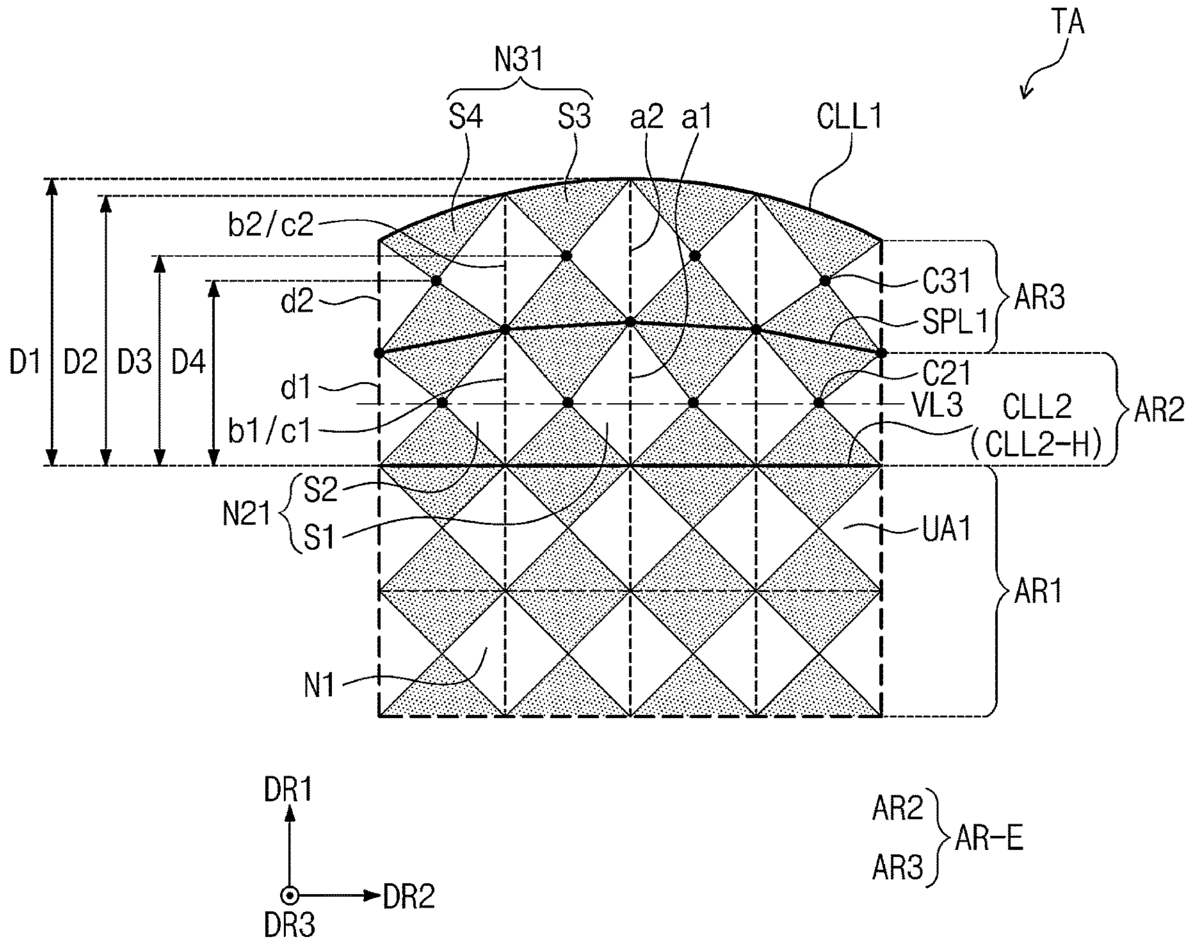

FIG. 6H illustrates an enlarged view of a portion of the center area AR1 (also referred to as a first area AR1) and a portion of the outer area AR-E adjacent to the first area AR1, and illustrates an enlarged view of an area adjacent to one horizontal side CCL2-H of the outer area AR-E. Hereinafter, referring to FIG. 6H, shapes of the first, (2-1)-th, and (3-1)-th nodes N1, N21, and N31 and arrangements of the (2-1)-th and (3-1)-th central points C21 and C31 will be described in detail.

Referring to FIG. 6H, the first nodes N1 in the first area AR1 may have a uniform area, where the size and shape of each of the first nodes N1 can be consistent. In contrast, at least a portion of the (2-1)-th nodes N21 in the second area AR2 may have a different area and different shape that may vary from each other. Also, at least some of the (2-1)-th nodes N21 may have a shape different from that of each of the first nodes N1. At least a portion of the (3-1)-th nodes N31 in the third area AR3 may also have a different area and different shape from each other. Also, at least portion of the (3-1)-th nodes N31 may have a shape different from that of each of the first nodes N1.

As illustrated in FIG. 6H, the (2-1)-th nodes N21 may include first and second sub-nodes S1 and S2 having different shapes and areas, and the (3-1)-th nodes N31 may include third and fourth sub-nodes S3 and S4 having different shapes and areas. The first and second sub-nodes S1 and S2 may be non-symmetrical, and the third and fourth sub-nodes S3 and S4 may be non-symmetrical, wherein each of the first to fourth sub-nodes can have an asymmetrical shape with respect to one diagonal.

The first sub-node S1 may include (1-1)-th an (2-1)-th sides a1 and b1 extending in the first direction DR1 orthogonal to the horizontal side CCL2-H and facing each other, and the (1-1)-th side a1 may be longer than the (2-1)-th side b1. The second sub-node S2 may include (3-1)-th and (4-1)-th sides c1 and d1 extending in the first direction DR1 orthogonal to the horizontal side CCL2-H and facing each other, and the (3-1)-th side c1 may be longer than the (4-1)-th side d1. The (2-1)-th side b1 may be equal to the (3-1)-th side c1, where first sub-node S1 and second sub-node S2 may share side b1/c1.

FIG. 6H illustrates that the first and second sub-nodes S1 and S2 are disposed to be in contact with each other through the (2-1)-th and (3-1)-th sides b1 and c1 as an example of where first and second sub-nodes S1 and S2 are adjoining. However, according to an embodiment of the inventive concept, the first and second sub-nodes S1 and S2 may be selected as nodes spaced apart from each other, and the (2-1)-th side b1 may be longer than the (3-1)-th side c1.

In various embodiments, a maximum width in the first direction DR1 orthogonal to the horizontal side CCL2-H of the first sub-node S1 may be greater than that in the first direction DR1 orthogonal to the horizontal side CCL2-H of the second sub-node S2. Thus, the first sub-node S1 may have a surface area greater than that of the second sub-node S2.

According to this embodiment, the (2-1)-th central points C21 may be disposed on the third virtual line VL3 (see e.g., FIG. 6F), so that a minimum spaced distance from the facing second closed line CLL2 is uniform. Thus, in the first to fourth patterns P1 to P4 (see FIG. 5A) provided in each of the (2-1)-th nodes N21, one pattern defined by the first intermediate lines D1-O and D2-O (see FIG. 6F) may have the same shape and area as one of the first to fourth patterns P1 to P4 (see FIG. 5A) disposed in the first node N1. The patterns having the uniform area and arrangement with the first area AR1 in a portion of the second area AR2 adjacent to the first area AR1 may be disposed to minimize deterioration of detection reliability and detection accuracy on the first area AR1.

The third sub-node S3 may include (1-2)-th an (2-2)-th sides a2 and b2 extending in the first direction DR1 orthogonal to the horizontal side CCL2-H and facing each other, and the (1-2)-th side a2 may be longer than the (2-2)-th side b2. The fourth sub-node S4 may include (3-2)-th and (4-2)-th sides c2 and d2 extending in the first direction DR1 orthogonal to the horizontal side CCL2-H and facing each other, and the (3-2)-th side c2 may be longer than the (4-2)-th side d2. The (2-2)-th side b2 may be equal to the (3-2)-th side c2, where third sub-node S3 and fourth sub-node S4 may share side b2/c2.

FIG. 6H illustrates that the third and fourth sub-nodes S3 and S4 are disposed to be in contact with each other through the (2-2)-th and (3-2)-th sides b2 and c2 as an example of where third and fourth sub-nodes S3 and S4 are adjoining. However, according to an embodiment of the inventive concept, the third and fourth sub-nodes S3 and S4 may be selected as nodes spaced apart from each other, and the (2-2)-th side b2 may be longer than the (3-2)-th side c2.

In various embodiments, a maximum width in the first direction DR1 orthogonal to the horizontal side CCL2-H of the third sub-node S3 may be greater than that in the first direction DR1 orthogonal to the horizontal side CCL2-H of the fourth sub-node S4. Thus, the third sub-node S3 may have a larger area than the fourth sub-node N4.

As the first closed line CLL1 has a curvature, a maximum spaced distance D1 in the second direction DR2 between one side of the third sub-node S3 having a curvature by being defined by the first closed line CLL1 and the first area AR1 may be greater than a maximum spaced distance D2 in the second direction DR2 between one side of the fourth sub-node S4 having a curvature by being defined by the first closed line CLL1 and the first area AR1.

The (3-1)-th central points C31 may not be arranged in one direction, and the spaced distance from the first area AR1 may vary for each position along the first closed line CLL1. A spaced distance D3 between the (3-1)-th central point C31 in the third sub-node S3 and the first area AR1 may be greater than a distance D4 between the (3-1)-th central point C31 in the fourth sub-node S4 and the first area AR1.

According to an embodiment of the inventive concept, when the (3-1)-th central point C31 is in the node in which the maximum spaced distance between one side defined by the first closed line CLL1 among the (3-1)-th nodes N31 and the first area AR1 is relatively large, a spaced distance between the (3-1)-th central point C31 and the first area AR1 may also be large.

Thus, the (3-1)-th central points C31 may be arranged in a direction similar to the extending direction of the first closed line CLL1. In this case, the (3-1)-th central points may be disposed to be adjacent to the first closed line CLL1 compared to a case in which the (3-1)-th central points are arranged in a line in the same manner as the arrangement of other central points. As a result, the sensing accuracy on the outermost area within the touch area TA may be improved.

When the detection reliability and accuracy are low on the outermost area within the touch area, a portion of the outermost area within the touch area may be intentionally set as a non-sensing area so that an area of the active area of the electronic device, on which an external input is substantially detected, may be reduced. According to this embodiment, the detection reliability and accuracy on the outermost area within the touch area TA may be improved, so that the non-sensing area may not be intentionally set or the area of the non-sensing area to be intentionally set may be reduced. Thus, in the active area DA (see FIG. 1B) of the electronic device 1000 (see FIG. 1B), an area capable of detecting the external input may substantially increase.

In an embodiment, the third sub-node S3 may be spaced apart from the first area AR1 in one direction with the first sub-node S1 therebetween, and the fourth sub-node S4 may be spaced apart from the first area AR1 in one direction with the second sub-node S2 therebetween. Here, as the (2-1)-th and (3-1)-th nodes N21 and N31 are divided through the first division lines SPL1 connecting the central points CTP (see FIG. 6G) to each other, the (1-1)-th and (2-1)-th sides a1 and b1 of the first sub-node S1 may have the same length as the (1-2)-th and (2-2)-th sides a2 and b2 of the third sub-node S3, respectively. Two sides of the first sub-node, which extend in the one direction, can have a same length as two sides of the third sub-node S3, which extend in the one direction, respectively. In addition, the (3-1)-th and (4-1)-th sides c1 and d1 of the second sub-node S2 may have the same length as the (3-2)-th and (4-2)-th sides c2 and d2 of the fourth sub-node S4, respectively. Two sides of the second sub-node, which extend in the one direction, can have a same length as two sides of the fourth node, which extend in the one direction, respectively. Thus, when the area of the first sub-node S1 is greater than the area of the second sub-node S2, the area of the third sub-node S3 may be greater than the area of the fourth sub-node S4.

According to an embodiment, while controlling the arrangement of the (3-1)-th central points C31, an area deviation between the patterns disposed in the (2-1)-th nodes N21 and the patterns disposed in the (3-1)-th nodes N31 may be reduced. Specifically, in the patterns disposed in the (2-1)-th nodes N21, a portion disposed between the third virtual line VL3 and the second closed line CLL2 may reduce an area deviation with the patterns disposed in the first nodes N1, and in the patterns disposed in the (2-1)-th nodes N21, a portion disposed between the third virtual line VL3 and the first division line SPL1 may reduce an area deviation with the patterns disposed in the (3-1)-th nodes N31. Thus, more improved sensing uniformity may be exhibited on the entire area of the touch area TA.

Therefore, according to this embodiment, the electronic device 1000 (see FIG. 1A) having improved detection reliability may be provided.

FIGS. 6G and 6H illustrate that each of the first and second outer lines D1-E and D2-E corresponds to one diagonal of the (3-1)-th node N31, but the embodiment of the inventive concept is not limited thereto. For example, in one (3-1)-the node N31s, a direction extending from the (3-1)-th central point C31 to the central point CTP adjacent the (3-1)-th central point C31 and a direction extending from the (3-1)-th central point C31 to the outer point EGP adjacent to the (3-1)-th central point C31 may be different from each other, and thus, each of the first and second outer lines D1-E and D2-E may have a shape bent at the (3-1)-th central point C31. Here, the (3-1)-th central points C31 may be arranged in a direction similar to the extending direction of the first closed line CLL1, and each of the (3-1)-th central points C31 may be set so that the first to fourth patterns P1 to P4 (see FIG. 5A) having more uniform areas are defined in the (3-1)-th node N31.

Figure 6I:
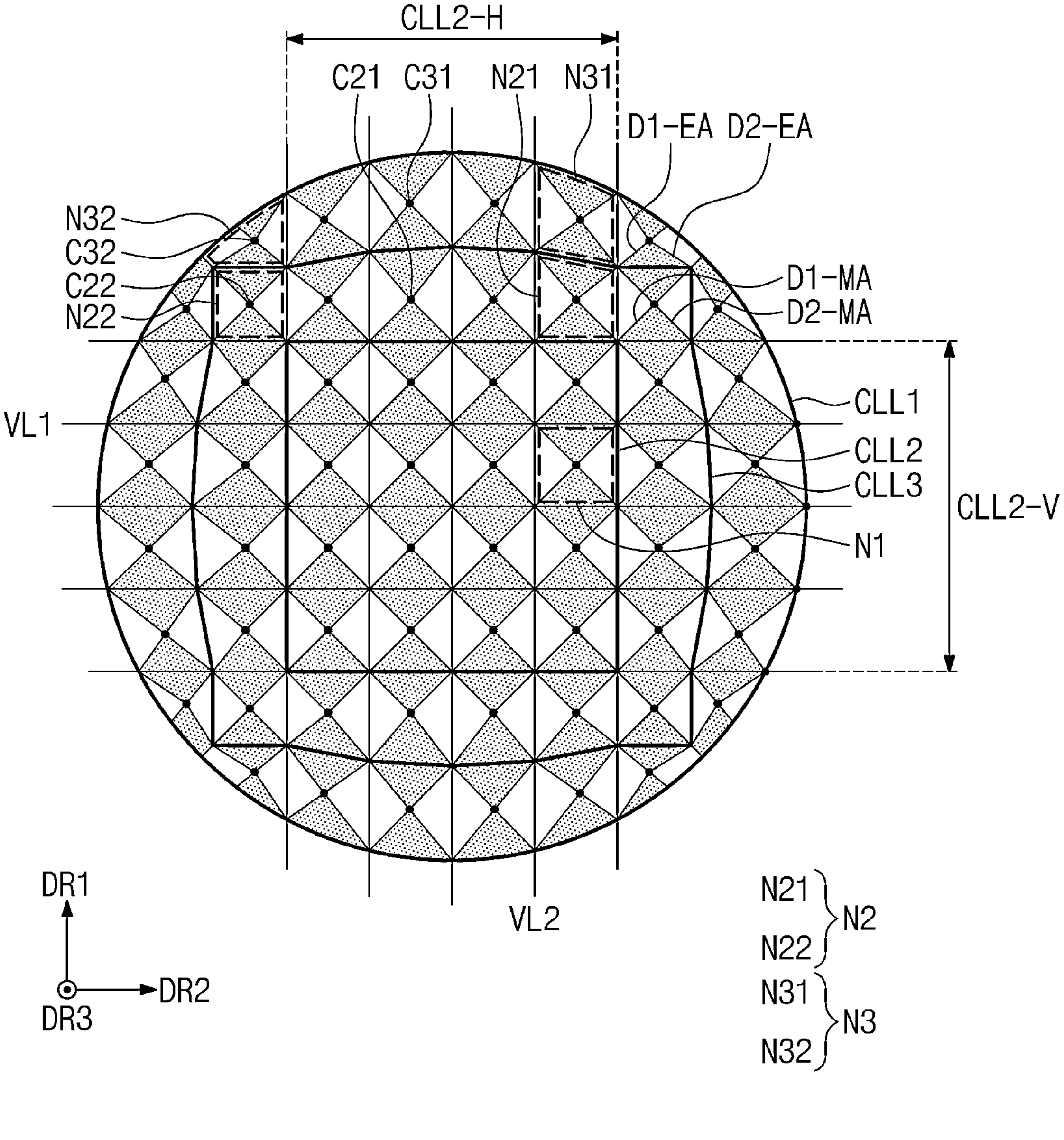

Thereafter, as illustrated in FIG. 6I, the first to fourth patterns P1 to P4 (see FIG. 5A) disposed in each of the (2-2)-th nodes N22 may be defined through additional intermediate lines D1-MA and D2-MA defined in the (2-2)-th nodes N22, where the additional intermediate lines D1-MA and D2-MA may be particular to the (2-2)-th nodes N22 based on the corner locations of (2-2)-th nodes N22.

The additional middle lines D1-MA and D2-MA may include first additional middle lines D1-MA and second additional middle lines D2-MA. In one (2-2)-th node N22, one first additional intermediate line D2-MA and one second additional intermediate line D2-MA may cross each other.

Each of central points (hereinafter, referred to as (2-2)-th central points C22) may be defined in each of the (2-2)-th nodes N22. Each of the (2-2)-th central points C22 may correspond to a point at which the first and second additional intermediate lines D1-MA and D2-MA cross each other.

In an embodiment, each of the first and second additional intermediate lines D1-MA and D2-MA may correspond to one diagonal of the (2-2)-th node N22, and thus, the (2-2)-th central points C22 may be defined as crossing points of two diagonals in the (2-2)-th node N22, where first and second additional intermediate lines D1-MA and D2-MA intersect. However, it is not limited thereto, and directions extending to vertexes of the (2-2)-th node N22 with respect to the (2-2)-th central point C22 may be different from each other. Here, each of the first and second additional intermediate lines D1-MA and D2-MA may have a shape bent at the (2-2)-th central point C22.

A planar shape of each of the first to fourth patterns P1 to P4 (see FIG. 5A) provided in each of the (2-2)-th nodes N22 may be defined by the first and second additional intermediate lines D1-MA and D2-MA. The patterns provided in each of the (2-2)-th nodes N22 may have symmetrical or asymmetrical shapes according to the shape of the second division line SPL2.

The first to fourth patterns P1 to P4 (see FIG. 5A) disposed on each of the (3-2)-th nodes N32 may be defined through the additional outer lines D1-EA and D2-EA defined in the (3-2)-th nodes N32. The additional outer lines D1-EA and D2-EA may be particular to the (3-2)-th nodes N32 based on the edge locations of (3-2)-th nodes N32.

The additional outer lines D1-EA and D2-EA may include first additional outer lines D1-EA and second additional outer lines D2-EA. In one (3-2)-th node N32, one first additional outer line D1-EA and one second additional outer line D2-EA may cross each other, where first and second additional outer lines D1-EA and D2-EA intersect.

In various embodiments, each of central points (hereinafter, referred to as (3-2)-th central points C32) may be defined in each of the (3-2)-th nodes N32. In an embodiment, the (3-2)-th central points C32 may be defined to be disposed inside the (3-2)-th nodes N32, respectively, and thus may be disposed in the active area DA (see FIG. 1B) of the electronic device 1000 (see FIG. 1B). Thus, according to this embodiment, all of the central points C31 and C32 defined by the third nodes N3 may be disposed within the active area DA (see FIG. 1B), and thus, touch sensitivity and detection accuracy on the outermost area in the touch area TA (see FIG. 6A) may be improved.

Each of the (3-2)-th central points C32 may correspond to a point at which the first and second additional outer lines D1-EA and D2-EA cross each other.

In an embodiment, directions extending to respective vertexes of the (3-2)-th node N32 with respect to the (3-2)-th central point C32 may be different from each other, and thus, each of the first and second additional outer lines D1-EA and D2-EA may have a shape bent at the (3-2)-th central point C32; however, it is not limited thereto, and each of the first and second additional outer lines D1-EA and D2-EA may correspond to one diagonal of the (3-2)-th node N32, and thus, the (3-2)-th central points C32 may be defined as crossing points of two diagonals in the (3-2)-th node N32.

In an embodiment, when the (3-1)-th nodes N31 defined through one first division line SPL1 (see FIG. 6E) may be regarded as one group nodes, the (3-2)-th nodes N32 may be disposed between every four group nodes. Here, the (3-2)-th nodes N32 may be defined so that the (3-1)-th and (3-2)-th nodes N31 and N32 may be disposed in a direction similar to the extending direction of the first closed line CLL1. As a result, the central points disposed at the outermost area may be adjacent to the first closed line CLL1 to minimize a difference between a path physically touched on the outermost area and a touch path detected by the input sensing part ISP (see FIG. 4). Thus, the sensing accuracy on the outermost area within the touch area TA (see FIG. 4) may be further improved.

In an embodiment in which the nodes other than the outermost nodes have the same shape and the same area, and the central points in the outermost nodes are disposed in the same direction as the arrangement of the central points in the other nodes, an error between the detected coordinates and the touched coordinates occurred on an area disposed inside by a maximum of about 2.10 millimeters (mm) from the outer line of the touch area.

In various embodiments, when the outer area AR-E (see FIG. 4) are divided into the second area AR2 (see FIG. 4) and the third area AR3 (see FIG. 4) surrounding the second area AR2, the shapes and areas of the outermost nodes (i.e., the third nodes N3) and the nodes (i.e., the second nodes N2) adjacent to the outermost nodes can be controlled, and the central points (i.e., the (3-1)-th and (3-2)-th central points C31 and C32) in the outermost nodes (i.e., the third nodes N3) are arranged in a direction similar to the extending direction of the outer line of the touch area TA (see FIG. 4), an error between the detected coordinates and the touched coordinates occurred on an area disposed inside by a maximum of about 0.73 millimeters (mm) from the outer line of the touch area TA (see FIG. 4). That is, in the case of this embodiment, it may be confirmed that the area on which the sensing error occurs is narrowed compared to the comparative embodiment. In addition, in the case of this embodiment, a smaller degree of the error between the detected coordinates and the touched coordinates occurred compared to the comparative embodiment.

According to an embodiment, it may be confirmed that the detection accuracy on the outermost area is improved. In addition, the area intentionally set as the non-sensing area may be reduced, or the non-sensing area may not be set in the touch area TA (see FIG. 4), and thus, it may be confirmed that the reduction of the area on which the external input is substantially sensed in the active area DA (see FIG. 1B) of the electronic device 1000 (see FIG. 1B) is minimized.

In various embodiments, a planar shape of each of the first to fourth patterns P1 to P4 (see FIG. 5A) provided in the (3-2)-th nodes N32 may be defined by the additional outer lines E1-EA and E2-EA. FIG. 6H illustrates shapes of the first to fourth patterns P1 to P4 (see FIG. 5A) provided in each of the (3-2)-th nodes N32 as an example, but is not limited thereto.

Figure 7:
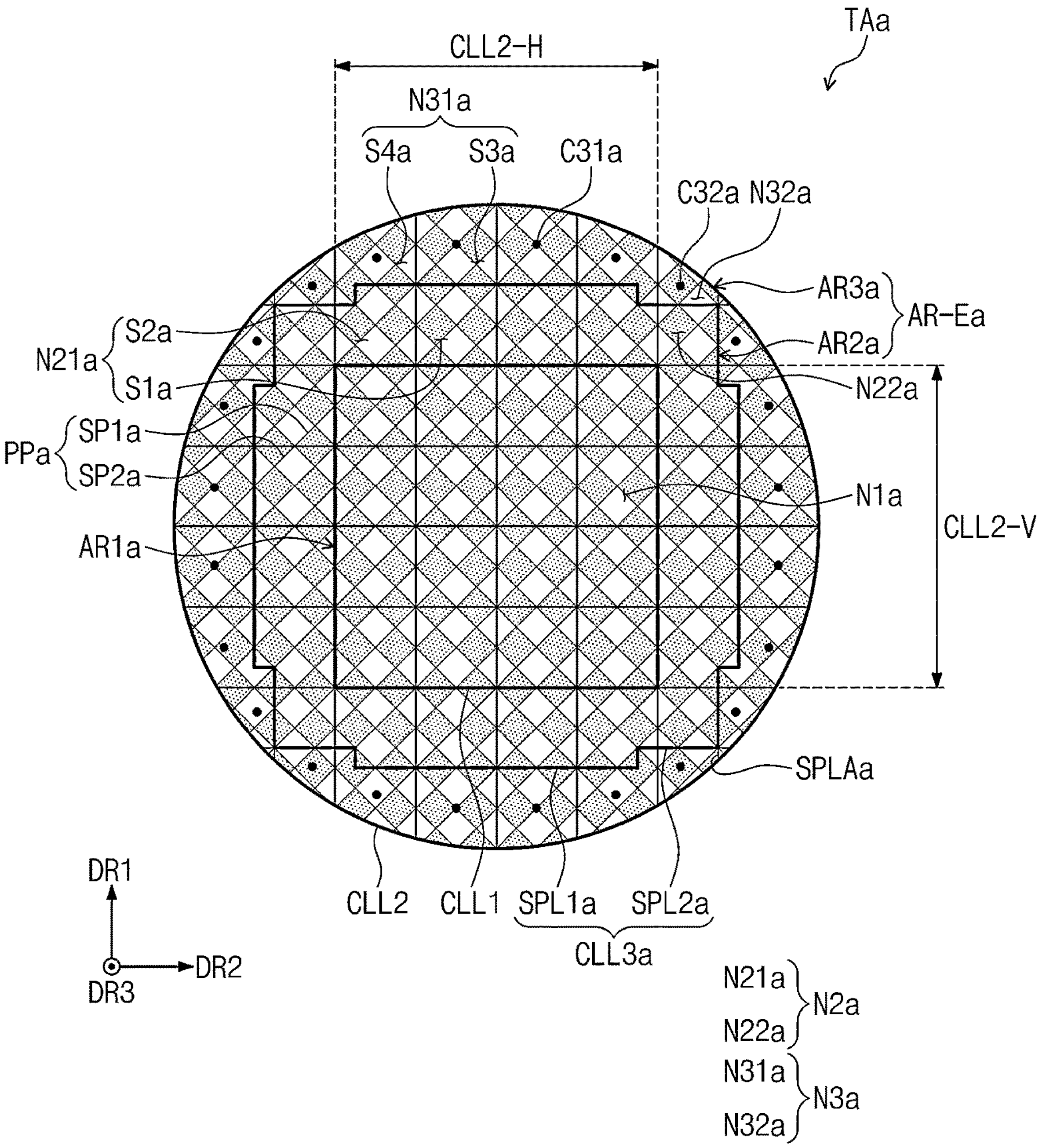
FIG. 7 is a plan view illustrating a touch area of the input sensing part according to an embodiment of the inventive concept.

FIG. 7 is a plan view illustrating the touch area of the input sensing part, according to an embodiment of the inventive concept.

Referring to FIG. 7, patterns PPa including first sensing patterns SP1*a* extending in the first direction DR1 and arranged in the second direction DR2 and second sensing patterns SP2*a* extending in the second direction DR2 and arranged in the first direction DR1 may be disposed on a touch area TAa.

In an embodiment, the first sensing patterns SP1*a* and the second sensing patterns SP2*a* may have spaces in which a portion of an outer portion of the touch area TAa is cut from the patterns having a regular shape (e.g., a rhombic shape) and a regular arrangement (e.g., arranged to cross each other in the first and second directions DR1 and DR2) according to the shape of the first closed line CLL1.

In the embodiment described above with reference to FIGS. 4 to 6J, each of the outer lines of one node may cross one first sensing pattern SP1 and may be divided into the first and second patterns P1 and P2 or may cross one second sensing pattern SP2 and may be divided into the third and fourth patterns P3 and P4. However, in the embodiment described with reference to FIG. 7, each of the outer lines of one node may cross the plurality of first and second sensing patterns SP1*a* and SP2*a*.

In this embodiment, the extending direction of the outer sides of one node may extend along diagonals of the patterns PPa or may extend in a direction different from the diagonals of the patterns PPa. That is, as a boundary of one node is set regardless of the shape of the patterns PPa, nodes N1*a*, N21*a*, N22*a*, N31*a*, and N32*a* having various shapes may be provided.

In various embodiments, the touch area TAa may include a center area AR1*a* (or first area AR1*a*) and an outer area AR-Ea, which are divided through the second closed line CLL2, and the outer area AR-Ea may include a second area AR2*a* and a third area AR3*a*, which are divided through a third closed line CLL3*a*.

The first area AR1*a* may be divided into first nodes N1*a*. The first nodes N1*a* may have a uniform area. The number of patterns PPa disposed on each of the first nodes N1*a* is not limited to that illustrated in FIG. 7.

The third closed line CLL3*a* may include first division lines SPL1*a*, which face the horizontal sides CLL2-H and the vertical sides CLL2-V, respectively, and second division lines SPL2*a* that connect the first division lines SPL1*a* to each other.

At least a portion of the first division line SPL1*a* may extend in a direction different from an extending direction of facing side among the sides of the second closed line CLL2. In addition, in this embodiment, a spaced distance between the first division line SPL1*a* and the second closed line CLL2 in the first direction DR1 or the second direction DR2 may be reduced as a spaced distance between the first closed line CLL1 and the second closed line CLL2 in the first direction DR1 or the second direction DR2 decreases.

FIG. 7 illustrates that the first division line SPL1*a* has a stepped portion having a stair shape as an example. The first division line SPL1*a* may include a portion extending in a direction different from the extending direction of the facing side among the sides of the second closed line CLL2 due to the stepped portion, and a spaced distance from the first area AR1 may vary. However, the shape of the first division line SPL1*a* is not limited thereto, and the first division line SPL1*a* may extend in a direction inclined with respect to the first direction DR1 or the second direction DR2, and thus, the spaced distance from the first area AR1 may vary. In addition, the first division line SPL1*a* may extend with a curvature so that the spaced distance from the first area AR1 varies.

The second area AR2*a* may be divided into second nodes N2*a*. At least a portion of the second nodes N2*a* may have a different area and shape. At least a portion of the second nodes N2*a* may have a different area and/or a different shape from those of the first nodes N1*a*.

The second nodes N2*a* may include (2-1)-th nodes N21*a* adjacent to the first division line SPL1*a* and (2-2)-th nodes N22*a* adjacent to the second division line SPL2*a*.

The third area AR3*a* may be divided into third nodes N3*a*. At least a portion of the third nodes N3*a* may have a different area and shape. At least a portion of the third nodes N3*a* may have an area and/or shape different from those of the first and second nodes N1*a* and N2*a*.

The third nodes N3*a* may include (3-1)-th nodes N31*a* adjacent to the first division line SPL1*a* and (3-2)-th nodes N32*a* adjacent to the second division line SPL2*a*.

As at least a portion of the first division line SPL1*a* extends in a direction different from the extending direction of the facing side among the sides of the second closed line CLL2, the (2-1)-th nodes N21*a* may include first and second sub-nodes Sla and S2*a* having different shapes and shapes. In addition, as the first closed line CLL1 has a curvature, the (3-1)-th nodes N31*a* may include third and fourth sub-nodes S3*a* and S4*a* having different shapes and areas.

(3-1)-th central points C31*a* may be defined in the (3-1)-th nodes N31*a*, respectively, and (3-2)-th central points C32*a* may be defined in the (3-2)-th nodes N32*a*, respectively. The description of the (3-1)-th nodes N31 and the (3-1)-th central points C31 described above in FIG. 6H may be similarly applied to the (3-1)-th nodes N31*a* and the (3-1)-th central points C31*a* of FIG. 7, and the description of the (3-2)-th nodes N32 and the (3-2)-th central points C32 described above in FIG. 6I may be similarly applied to the (3-2)-th nodes N32*a* and (3-2)-th central points C32*a* of FIG. 7.

Both the (3-1)-th and (3-2)-th central points C31*a* and C32*a* may be defined in the touch area TAa and disposed on the active area DA (see FIG. 1B) of the electronic device 1000 (see FIG. 1B). The (3-1)-th and (3-2)-th central points C31*a* and C32*a* may be defined to be arranged in the direction similar to the extending direction of the first closed line CLL1 to improve the touch accuracy of the outermost area of the touch area TAa.

Figure 8:
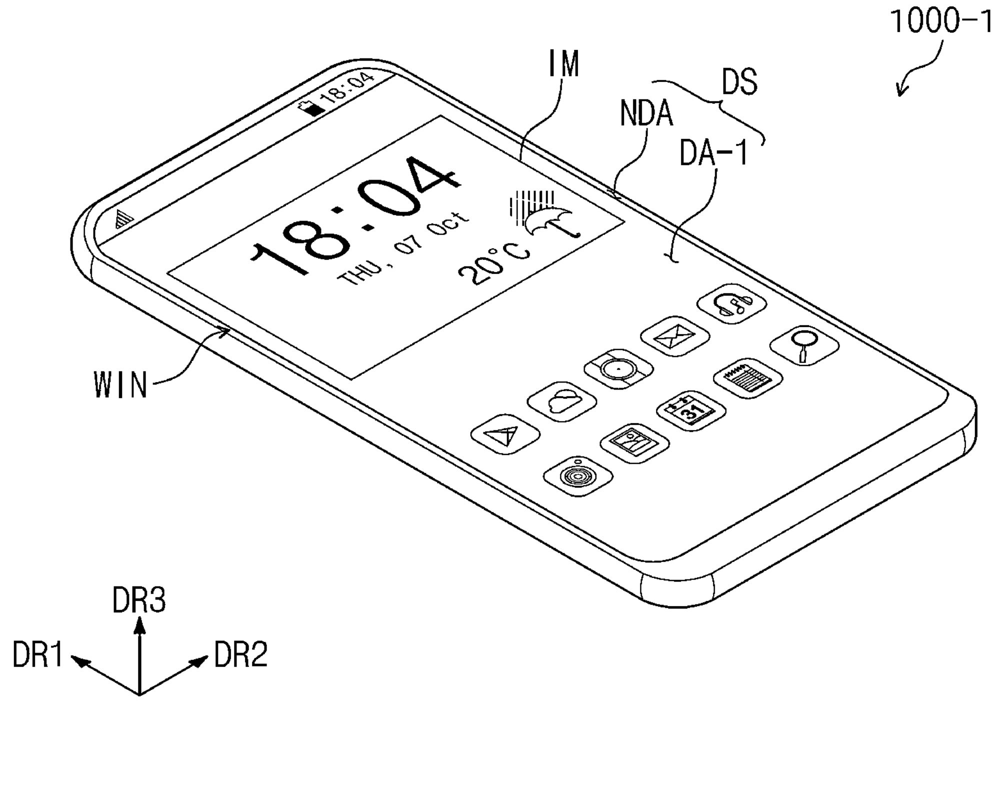
FIG. 8 is a perspective view illustrating a state of use of the electronic device according to an embodiment of the inventive concept.
Figure 9A:
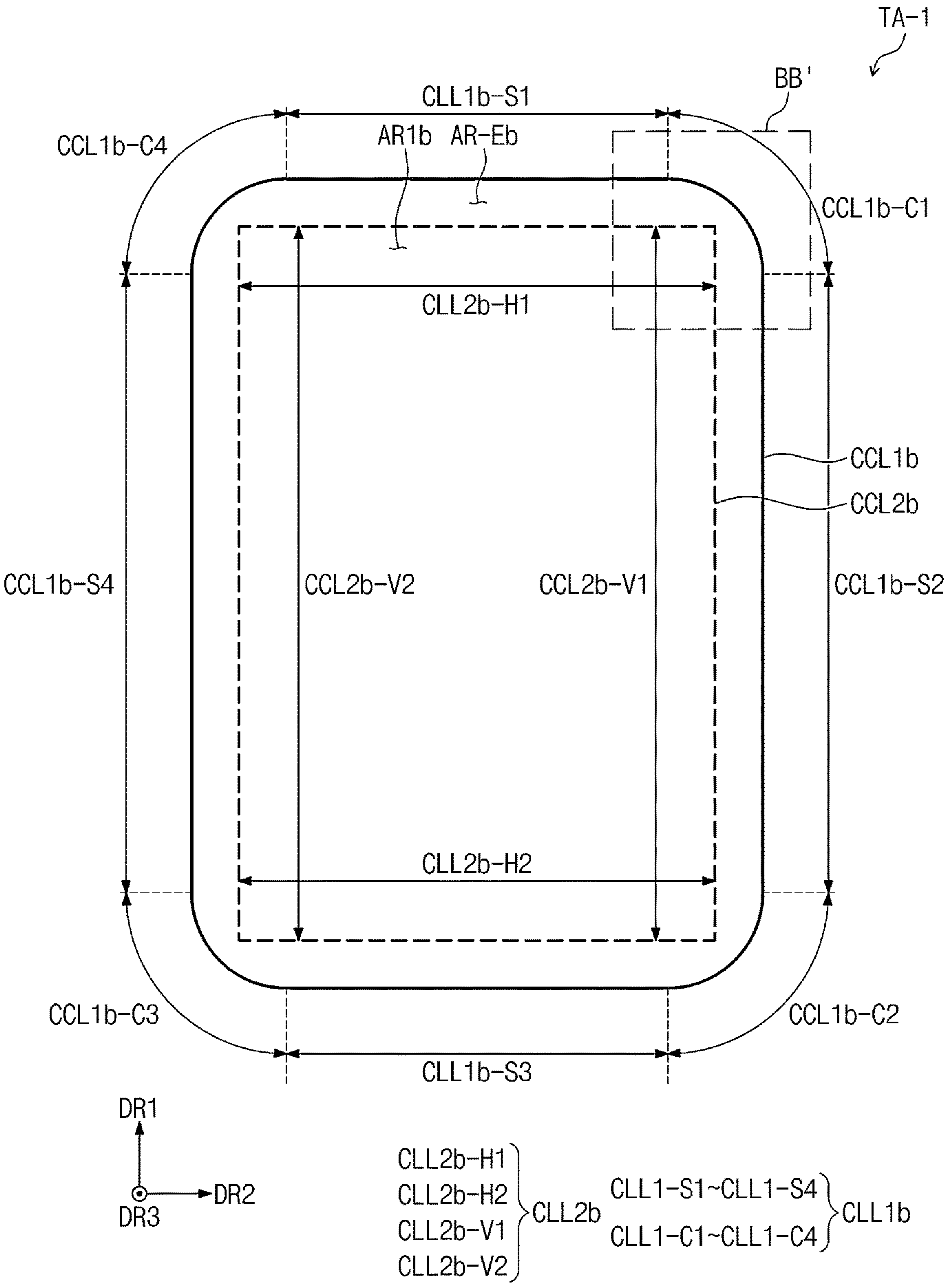
FIG. 9A is a plan view illustrating a touch area of the input sensing part according to an embodiment of the inventive concept.
Figure 9B:
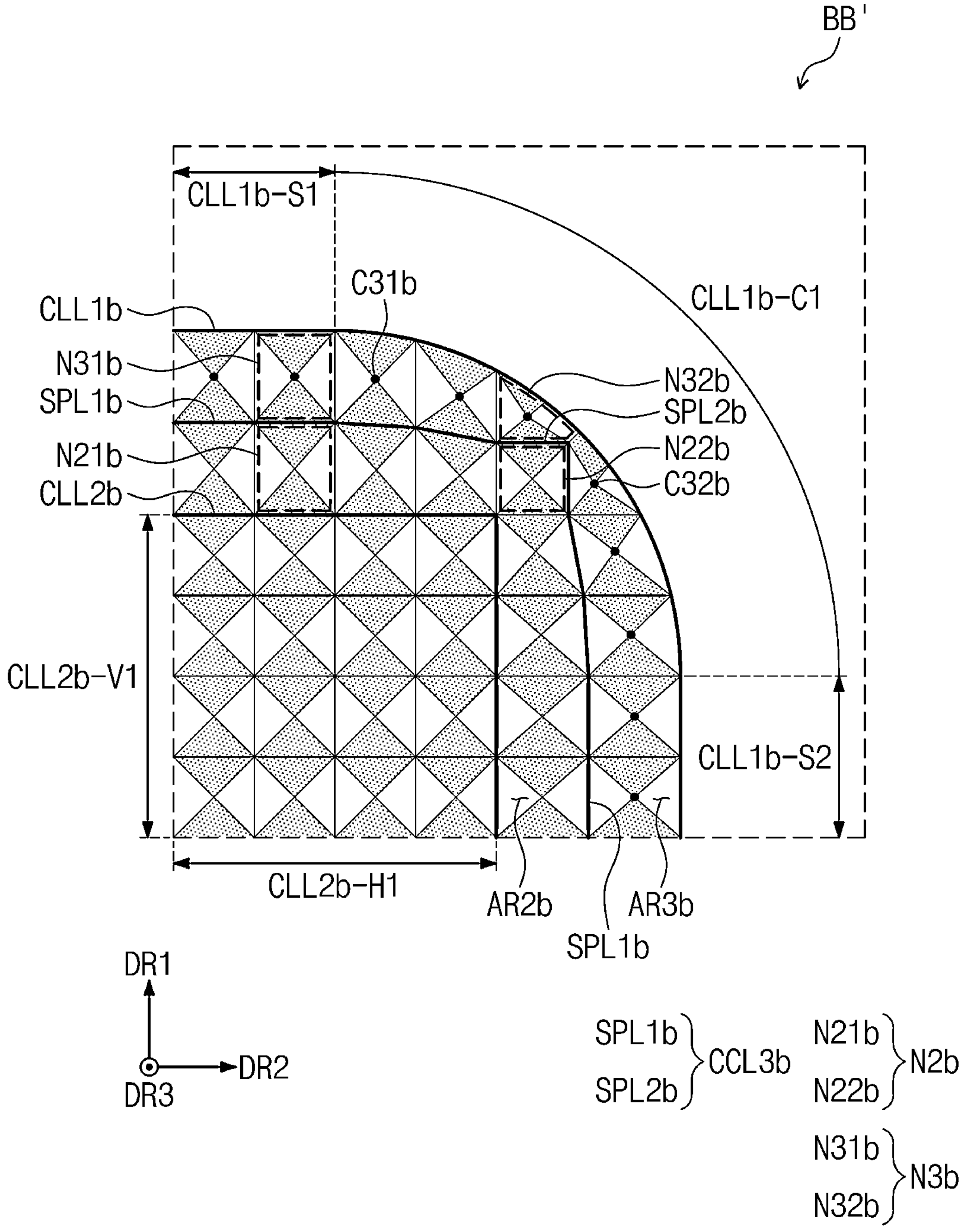
FIG. 9B is a plan view illustrating an area BB' of FIG. 9A in the input sensing part according to an embodiment of the inventive concept.

FIG. 8 is a perspective view illustrating a state of use of the electronic device according to an embodiment of the inventive concept. FIG. 9A is a schematic plan view illustrating the touch area of the input sensing part according to an embodiment of the inventive concept. FIG. 9B is a plan view illustrating an area BB' of FIG. 9A in the input sensing part according to an embodiment of the inventive concept.

Referring to FIG. 8, features of an electronic device 1000-1 may be applied to a device that is activated according to an electrical signal in addition to the wearable device 1000WA (see FIG. 1A). For example, the electronic device 1000-1 may be a television, a monitor, an external billboard, a game machine, a personal computer, a notebook computer, a mobile phone, a tablet, a game machine, and a navigation device, but is not particularly limited thereto. FIG. 8 illustrates an example in which the mobile phone is provided as the electronic device 100.

The electronic device 1000-1 may include a display surface DS including an active area DA-1 and a peripheral area NDA, where the peripheral area NDA can be around the active area DA-1. The display area DA-1 may have a rectangular shape and may have a shape in which corners between two sides face each other are rounded (or otherwise have a predetermined curvature). The shape of the display area DA-1 is not limited thereto, and only a portion of the corners between the two sides may have a rounded shape, and others of the corners between the two sides may be sharp corners (e.g., 90 degrees).

Referring to FIG. 9A, an input sensing part ISP (see FIG. 4) in the electronic device 1000-1 (see FIG. 8) may include a touch area TA-1 having a shape different from that of the touch area TA illustrated in FIG. 4. In this embodiment, the touch area TA-1 may have a shape in which at least one curved side CCL1*b*-C1 to CCL1*b*-C4 disposed between straight sides CCL1*b*-S1 to CCL1*b*-S4 and straight sides CCL1*b*-S1 to CCL1*b*-S4 on a plane are provided. FIG. 9A illustrates that the touch area TA-1 can have a quadrangular shape, in which corners between two sides are rounded, as an example.

In this embodiment, the first closed line CCL1*b* may include four straight sides (hereinafter, first to fourth straight sides CCL1*b*-S1 to CCL1*b*-S4) and four curved sides (hereinafter, first to fourth straight sides CCL1*b*-S1 to CCL1*b*-S4). Each of the first and third straight sides CCL1*b*-S1 and CCL1*b*-S3 may extend in the second direction DR2 and may be spaced apart from each other in the first direction DR1. Each of the second and fourth straight sides CCL1*b*-S2 and CCL1*b*-S4 may extend in the first direction DR1 and may be spaced apart from each other in the second direction DR2. The first to fourth curved edges CCL1*b*-C1 to CCL1*b*-C4 may be disposed between adjacent straight lines among the first to fourth straight lines CCL1*b*-S1 to CCL1*b*-S4, respectively.

The number of straight sides CCL1*b*-S1 to CCL1*b*-S4 and the number of curved sides CCL1*b*-C1 to CCL1*b*-C4 of the first closed line CCL1*b* are illustrated as examples, but are not limited thereto.

The touch area TA-1 may include a center area AR1*b* and an outer area AR-Eb, which are divided by the second closed line CCL2*b*. In this embodiment, the center area AR1*b* may be defined to have a polygonal shape. Thus, the second closed line CCL2*b* may be defined as a single closed line having a polygonal shape and may include a plurality of straight sides.

In an embodiment, the second closed line CCL2*b* may include a quadrangular shape and include two horizontal sides (hereinafter, first and second horizontal sides CCL2*b*-H1 and CCL2*b*-H2) and two vertical sides (hereinafter, referred to as first and second horizontal sides CCL2*b*-V1 and CCL2*b*-V2).

In various embodiments, the first horizontal side CCL2*b*-H1 may face the first straight side CCL1*b*-S1 of the first closed line CCL1*b* and the first and fourth curved sides CCL1*b*-C1 and CCL1*b*-C4 adjacent thereto. The second horizontal edge CCL2*b*-H2 may face the third straight edge CCL1*b*-S3 of the first closed line CCL1*b* and the second and third curved edges CCL1*b*-C2 and CCL1*b*-C3 adjacent thereto.

The first vertical side CCL2*b*-V1 may face the second straight side CCL1*b*-S2 of the first closed line CCL1*b* and the first and second curved sides CCL1*b*-C1 and CCL1*b*-C2 adjacent thereto. The second vertical side CCL2*b*-V2 may face the fourth straight side CCL1*b*-S4 of the first closed line CCL1*b* and the third and fourth curved sides CCL1*b*-C3 and CCL1*b*-C4 adjacent thereto.

In various embodiments, each of the sides of the second closed line CCL2*b* may include both a portion facing the straight side and a portion facing the curved side of the first closed line CCL1*b*.

FIG. 9B is an enlarged view of a rounded portion of the touch area TA-1 (see FIG. 9A). FIG. 9B illustrates portions of the first and second straight sides CCL1*b*-S1 and CCL1*b*-S2 and the first curved side CCL1*b*-C1 disposed therebetween of a first closed line CCL1*b* as an example and also illustrates a portion of the first horizontal side CC2*b*-H1 and a portion of the first vertical side CCL2*b*-V1 of the second closed line CCL2*b*, which face the first and second straight sides CCL1*b*-S1 and CCL1*b*-S2 and the first curved side CCL1*b*-C1, as an example.

Referring to FIG. 9B, a third closed line CLL3*b* including a first division line SPL1*b* and a second division line SPL2*b* may be defined on the outer area AR-Eb (see FIG. 9A). The outer area AR-Eb (see FIG. 9A) may be divided into a second area AR2*b* and a third area AR3*b* by the third closed line CLL3*b*.

FIG. 9B illustrates a portion of the first division line SPL1*b* facing the first horizontal side CCL2*b*-H1, a portion of the first division line SPL1*b* facing the first vertical side CCL2*b*-V1, and a second division line SPL2*b* connecting the portions of the first division line SPL1*b* to each other as an example.

According to an embodiment, a portion of the first division line SPL1*b* facing the first straight line CCL1*b*-S1 or the second straight line CCL1*b*-S2 may extend in the same direction as the extending direction of a facing side of the sides of the second closed line CLL2*b*. A portion of the first division line SPL1*b* facing the first curved side CCL1*b*-C1 may extend in a direction different from the extending direction of the facing side of the second closed line CLL2*b*. A portion of the first division line SPL1*b* facing the first curved side CCL1*b*-C1 may not be parallel to the facing side of the sides of the second closed line CLL2*b*.

The description of the first division line SPL1 described above with reference to FIG. 6D may be similarly applied to a portion of the first division line SPL1*b* of FIG. 9B facing the first curved side CCL1*b*-C1. Also, the description of the second division line SPL2 described above in FIG. 6E may be similarly applied to the second division line SPL2*b* of FIG. 9B.

The second area AR2*b* may include second nodes N2*b*, and the second nodes N2*b* may include (2-1)-th nodes N21*b* adjacent to the first division lines SPL1*b* and (2-2)-th nodes N22*b* adjacent to the second division line SPL2*b*.

According to an embodiment, nodes adjacent to the first straight side CLL1*b*-S1 or the second straight side CLL1*b*-S2 in the (2-1)-th nodes N21*b* may have the same shape and area. In the (2-1)-th nodes N21*b*, nodes adjacent to the first curved side CLL1*b*-C1 may include sub-nodes having shapes and areas different from each other, and the description of the first and second sub-nodes S1 and S2 described above with reference to FIG. 6H may be similarly applied to the sub-nodes.

The description of the (2-2)-th nodes N22 described with reference to in FIG. 6E may be similarly applied to the (2-2)-th nodes N22*b*, and thus detailed descriptions thereof will be omitted.

In various embodiments, the third area AR3*b* may include third nodes N3*b*, and the third nodes N3*b* may include (3-1)-th nodes N31*b* adjacent to the first division lines SPL1*b* and (3-2)-th nodes N32*b* adjacent to the second division line SPL2*b*.

According to this embodiment, nodes adjacent to the first straight side CLL1*b*-S1 or the second straight side CLL1*b*-S2 in the (3-1)-th nodes N31*b* may have the same shape and area. In the (3-1)-th nodes N31*b*, nodes adjacent to the first curved side CLL1*b*-C1 may include sub-nodes having shapes and areas different from each other, and the description of the third and fourth sub-nodes S3 and S4 described above with reference to FIG. 6H may be similarly applied to the sub-nodes.

The description of the (3-2)-th nodes N32 described with reference to in FIG. 6E may be similarly applied to the (3-2)-th nodes N22*b*, and thus detailed descriptions thereof will be omitted.

In various embodiments, the (3-1)-th central points C31*b* may be defined in the (3-1)-th nodes N31*b*, and (3-2)-th central points C32*b* may be defined in the (3-2)-th nodes N32*b*.

In this embodiment, in the (3-1)-th nodes N31*b*, the (3-1)-th central points C31*b* disposed in the nodes adjacent to the first straight line CLL1*b*-S1 or the second straight line CLL1*b*-S2 may be arranged in the same direction as the extending direction of the facing side of the sides of the second closed line CLL2*b*. In the (3-1)-th nodes N31*b*, the (3-1)-th central points C31*b* disposed in the nodes adjacent to the first curved side CLL1*b*-C1 may be arranged in a direction different from the extending direction of the facing side of the sides of the second closed line CLL2*b*, and the description of the (3-1)-th central points C31 described with reference to FIG. 6D may be similarly applied to the (3-1)-th central points C31*b*.

The description of the (3-2)-th central points C32 described with reference to FIG. 6I may be similarly applied to the (3-2)-th central points C32*b*, and thus a detailed description thereof will be omitted.

In this embodiment, all the (3-1)-th and (3-2)-th central points C31*b* and C32*b* may be defined to be disposed within the (3-1)-th and (3-2)-th nodes N31*b* and N32*b*, and thus, all of the (3-1)-th and (3-2)-th central points C31*b* and C32*b* may be disposed within the active area DA-1 (see FIG. 8) of the electronic device 1000-1 (see FIG. 8). Therefore, the touch sensitivity and sensing accuracy on the outermost area within the touch area TA-1 (see FIG. 9A) may be improved. In addition, the (3-1)-th and (3-2)-th central points C31*a* and C32*a* may be defined to be arranged in the direction similar to the extending direction of the first closed line CLL1*b* to improve the touch accuracy of the outermost area of the touch area TA-1.

According to the embodiments of the inventive concept, in the touch area of which at least a portion is provided as the outer line having the curvature, the sensing accuracy may be improved on the outer area to implement the electronic device having the improved sensing reliability.

It will be apparent to those skilled in the art that various modifications and deviations can be made in the inventive concept. Thus, it is intended that the inventive concept covers the modifications and deviations of this invention provided they come within the scope of the appended claims and their equivalents. Accordingly, the technical scope of the inventive concept should not be limited to the contents described in the detailed description of the specification, but should be determined by the claims.

What is claimed is:

1. An electronic device comprising:

an input sensing part on an active area of a display panel, wherein the input sensing part includes a first area, a second area around the first area, and a third area surrounding the first area and the second area, wherein the input sensing part comprises first to third nodes disposed on the first to third areas, respectively; wherein each of the first to third nodes comprises:

a first connection pattern;

a first sensing pattern comprising a first pattern and a second pattern spaced apart from each other in a first direction with the first connection pattern therebetween;

a second connection pattern; and a second sensing pattern comprising a third pattern and a fourth pattern spaced apart from each other in a second direction crossing the first direction with the second connection pattern therebetween, wherein an outer line of the third area is defined by a first closed line, an outer line of the first area is defined by a second closed line, the second area and the third area are divided by a third closed line, wherein the third closed line comprises at least a portion not parallel to a side of the second closed line, and wherein at least a projection of the portion of the third closed line overlaps a corresponding side of the second closed line in the first direction, in a plan view.

2. The electronic device of claim 1, wherein, the third closed line comprises:

first division lines facing sides of the second closed line, respectively; and second division lines configured to connect the first division lines to each other, wherein at least a portion of the first division lines comprises a portion extending in a direction different from an extending direction of a facing side of the sides of the second closed line, wherein a projection of the portion of the at least a portion of the first division lines overlaps the facing side of the sides of the second closed line in the first direction, in a plan view, and wherein the portion of the at least a portion of the first division lines is an upper boundary of a second node of the second nodes, in a plan view.

3. The electronic device of claim 1, wherein, in each of the first to third nodes, the second connection pattern has a shape integrated with the second sensing pattern, and a center of gravity of the second connection pattern is at a central point.

4. The electronic device of claim 1, wherein the first closed line comprises at least a portion has a curvature.

5. The electronic device of claim 4, wherein the second closed line has a polygonal shape.

6. The electronic device of claim 5, wherein a point at which the first connection pattern and the second connection pattern, which are provided in each of the first to third nodes, cross each other is a central point, and the central points disposed in the second nodes adjacent to one first division line are arranged in a same direction as an extending direction of a side facing the one first division line of the sides of the second closed line.

7. The electronic device of claim 5, wherein one pattern adjacent to the second closed line among the first to fourth patterns provided in each of the second nodes has the same shape and area as one of the first to fourth patterns provided in each of the first nodes.

8. The electronic device of claim 5, wherein a point at which the first connection pattern and the second connection pattern, which are provided in each of the first to third nodes, cross each other is a central point, and the central points disposed in the third nodes adjacent to one first division line are arranged in a direction different from an arrangement direction of the central points disposed in the first nodes.

9. The electronic device of claim 4, wherein the first closed line comprises straight sides and at least one curved side disposed between the straight sides.

10. The electronic device of claim 1, wherein each of the first nodes have the same area and shape.

11. An electronic device comprising:

a display panel comprising an active area and a peripheral area adjacent to the active area; and an input sensing part on the display panel and comprising a first area, a second area configured to surround the first area, and a third area configured to surround the second area, wherein the first area, the second area, and the third area overlap the active area, wherein the input sensing part comprises first to third nodes, which are disposed on the first to third areas, respectively;

wherein each of the first to third nodes comprises:

a first connection pattern;

a first sensing pattern comprising a first pattern and a second pattern spaced apart from each other in a first direction with the first connection pattern therebetween;

a second connection pattern; and a second sensing pattern comprising a third pattern and a fourth pattern spaced apart from each other in a second direction crossing the first direction with the second connection pattern therebetween, wherein the second nodes comprise a first sub-node and a second sub-node, which have areas different from each other, each of the first and second sub-nodes comprises two sides extending in direction different from each other, wherein an outer line of the third area is defined by a first closed line, an outer line of the first area is defined by a second closed line, the second area and the third area are divided by a third closed line, wherein the third closed line comprises at least a portion not parallel to a side of the second closed line, and wherein at least a projection of the portion of the third closed line overlaps a corresponding side of the second closed line in the first direction, in a plan view.

12. The electronic device of claim 11, wherein, the third closed line comprises:

first division lines facing sides of the second closed line, respectively; and second division lines configured to connect the first division lines to each other, wherein at least a portion of the first division lines comprises a portion extending in a direction different from an extending direction of a facing side of the sides of the second closed line, wherein a projection of the portion of the at least a portion of the first division lines overlaps the facing side of the sides of the second closed line in the first direction, in a plan view, and wherein the portion of the at least a portion of the first division lines is an upper boundary of a second node of the second nodes, in a plan view.

13. The electronic device of claim 11, wherein the third nodes comprise a third sub-node and a fourth sub-node, which have areas different from each other, and one side of each of the third and fourth sub-nodes has a curvature.

14. The electronic device of claim 13, wherein each of the first to fourth sub-nodes has an asymmetrical shape with respect to one diagonal.

15. The electronic device of claim 13, wherein the third sub-node is spaced apart from the first area in one direction with the first sub-node therebetween, and two sides of the first sub-node, which extend in the one direction, have a same length as two sides of the third sub-node, which extend in the one direction, respectively.

16. The electronic device of claim 13, wherein the third sub-node is spaced apart from the first area in one direction with the first sub-node therebetween, and the fourth sub-node is spaced apart from the first area in the one direction with the second sub-node therebetween, and the first sub-node has an area greater than that of the second sub-node, and the third sub-node has an area greater than that of the fourth sub-node.

17. The electronic device of claim 13, wherein a maximum spaced distance between a side having a curvature of the third sub-node and the first area is greater than that between a side having a curvature of the fourth sub-node and the first area, in each of the third and fourth sub-nodes, and a center of gravity of the second connection pattern is a central point, and a spaced distance between the central point disposed in the third sub-node and the first area is greater than that between the central point disposed in the fourth sub-node and the first area.

18. The electronic device of claim 12, wherein each of the second nodes has an area equal to or greater than about ½ of an area of each of the first nodes, and each of the third nodes has an area equal to or greater than about ½ of an area of each of the first nodes.

19. The electronic device of claim 12, wherein the input sensing part comprises at least one insulating layer, the second connection pattern, the first sensing pattern, and the second sensing pattern are disposed on the same layer, the first connection pattern is disposed on a layer different from the layer, on which the second connection pattern, the first sensing pattern, and the second sensing pattern are disposed, with the insulating layer therebetween, and the first connection pattern is electrically connected to the first sensing pattern through a contact hole passing through at least one of the at least one insulating layer.

20. An electronic device comprising:

a display panel comprising an active area and a peripheral area adjacent to the active area; and an input sensing part disposed on the display panel and comprising a first area, a second area configured to surround the first area, and a third area configured to surround the second area, wherein each of the first area, the second area, and the third area overlaps the active area, wherein the first area is divided into a plurality of first nodes, the second area is divided into a plurality of second nodes, and the third area is divided into a plurality of third nodes, wherein the second nodes comprise a first sub-node and a second sub-node, which have areas different from each other, and the third nodes comprise a third sub-node and a fourth sub-node, which have areas different from each other, wherein an outer line of the third area is defined by a first closed line, an outer line of the first area is defined by a second closed line, the second area and the third area are divided by a third closed line, wherein the third closed line comprises at least a portion not parallel to a side of the second closed line, and wherein at least a projection of the portion of the third closed line overlaps a corresponding side of the second closed line in a first direction, in a plan view.

* * * * *